United States Patent
Kwon

(10) Patent No.: US 11,574,980 B2
(45) Date of Patent: Feb. 7, 2023

(54) WINDOW MEMBER AND ELECTRONIC APPARATUS INCLUDING IHE SAME

(71) Applicant: Samsung Display Co., Ltd., Yongin-si (KR)

(72) Inventor: Sungyong Kwon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/346,285

(22) Filed: Jun. 13, 2021

(65) Prior Publication Data

US 2021/0305345 A1 Sep. 30, 2021

Related U.S. Application Data

(63) Continuation of application No. 16/514,980, filed on Jul. 17, 2019, now Pat. No. 11,038,004.

(30) Foreign Application Priority Data

Sep. 28, 2018 (KR) ........................ 10-2018-0115918

(51) Int. Cl.
*H01L 27/32* (2006.01)
*H01L 51/52* (2006.01)
*G02B 5/00* (2006.01)

(52) U.S. Cl.
CPC .......... *H01L 27/3272* (2013.01); *G02B 5/003* (2013.01); *H01L 51/5237* (2013.01)

(58) Field of Classification Search
None
See application file for complete search history.

(56) References Cited

U.S. PATENT DOCUMENTS

| 10,252,935 B2 | 4/2019 | Murata et al. |
| 10,520,662 B1 | 12/2019 | Chen et al. |
| 10,620,665 B2 | 4/2020 | Cheng |
| 11,038,004 B2 * | 6/2021 | Kwon ................. H01L 27/3272 |
| 2013/0094184 A1 | 4/2013 | Lee |
| 2013/0177302 A1 | 7/2013 | Weber |

(Continued)

FOREIGN PATENT DOCUMENTS

| KR | 10-2015-0081006 | 7/2015 |
| KR | 10-2017-0111827 | 10/2017 |

OTHER PUBLICATIONS

Non-Final Office Action dated Sep. 10, 2020, in U.S. Appl. No. 16/514,980.

(Continued)

*Primary Examiner* — Rodney E Fuller
(74) *Attorney, Agent, or Firm* — H.C. Park & Associates, PLC

(57) ABSTRACT

A window member includes a base panel which is divided into a transmission area and a bezel area in a plan view and has a front surface and a rear surface disposed opposite to the front surface in a thickness direction, and in which a recessed portion, which is recessed from the rear surface in the thickness direction, is defined, a bezel layer disposed on the rear surface of the base panel to define the bezel area, and a light shielding pattern disposed in the recessed portion to cover an inner surface of the recessed portion. Here, the light shielding pattern is disposed on the transmission area and spaced apart from the bezel layer.

18 Claims, 15 Drawing Sheets

(56) References Cited

U.S. PATENT DOCUMENTS

| | | |
|---|---|---|
| 2016/0202515 A1 | 7/2016 | Watanabe et al. |
| 2017/0059771 A1 | 3/2017 | Yuki et al. |
| 2017/0287992 A1 | 10/2017 | Kwak et al. |
| 2019/0347462 A1 | 11/2019 | Tseng et al. |
| 2020/0020753 A1 | 1/2020 | Zhang et al. |
| 2020/0106055 A1 | 4/2020 | Zhang |
| 2020/0185660 A1 | 6/2020 | Kim et al. |
| 2020/0192148 A1 | 6/2020 | Kim et al. |
| 2020/0203660 A1 | 6/2020 | Shi |
| 2020/0236259 A1 | 7/2020 | Nakamura et al. |

OTHER PUBLICATIONS

Notice of Allowance dated Feb. 19, 2021, in U.S. Appl. No. 16/514,980.

* cited by examiner

WINDOW MEMBER AND ELECTRONIC APPARATUS INCLUDING THE SAME

CROSS-REFERENCE TO RELATED APPLICATION

This application claims is a Continuation of U.S. patent application Ser. No. 16/514,980, filed Jul. 17, 2019, which claims priority from and the benefit of Korean Patent Application No. 10-2018-0115918, filed on Sep. 28, 2018, each of which is hereby incorporated by reference for all purposes as if fully set forth herein.

BACKGROUND

Field

Exemplary implementations of the invention relate generally to a window member and an electronic apparatus including the same and, more specifically, to a window member having reduced visibility/improved appearance and an electronic apparatus including the same.

Discussion of the Background

An electronic apparatus is activated according to an electric signal. The electronic apparatus may include a display panel for displaying an image or a touch sensor for detecting an external input. In the display panel, an organic light emitting display panel has low power consumption, high luminance, and a high reaction speed.

Also, the electronic apparatus may include an electronic module for receiving an external signal or providing an output signal to the outside. The electronic module is accommodated in a housing member or the like together with the display panel to constitute the electronic apparatus.

The above information disclosed in this Background section is only for understanding of the background of the inventive concepts, and, therefore, it may contain information that does not constitute prior art.

SUMMARY

Devices constructed according to exemplary embodiments of the invention are capable of providing a window member for preventing various defects in an area on which an electronic module is disposed from being seen and an electronic apparatus including the same.

Additional features of the inventive concepts will be set forth in the description which follows, and in part will be apparent from the description, or may be learned by practice of the inventive concepts.

An exemplary embodiment of the inventive concepts provides a window member including: a base panel which is divided into a transmission area and a bezel area in a plan view and has a front surface and a rear surface disposed opposite to the front surface in a thickness direction, and in which a recessed portion, which is recessed from the rear surface in the thickness direction, is defined; a bezel layer disposed on the rear surface of the base panel to define the bezel area; and a light shielding pattern disposed in the recessed portion to cover an inner surface of the recessed portion. Here, the light shielding pattern is disposed on the transmission area and spaced apart from the bezel layer.

In an embodiment, the recessed portion may have a closed curve shape on the plane, and the recessed portion may have a depth that is less than a thickness of the base panel.

In an embodiment, the light shielding pattern may have a thickness that is the same as the depth of the recessed portion.

In an embodiment, the light shielding pattern may include: a first portion filled in the recessed portion; and a second portion connected to the first portion and configured to cover at least a portion of the rear surface of the base panel.

In an embodiment, the recessed portion may include a through-hole having the substantially same depth as a thickness of the base panel and passing through the base panel, and the light shielding pattern may cover an inner surface of the through-hole.

In an embodiment, the window member may further include a hole panel disposed in the through-hole, and the light shielding pattern may be disposed between the hole panel and the base panel.

In an embodiment, the hole panel may contain the same material as the base panel.

In an embodiment, the light shielding pattern may have an adhesion property.

In an embodiment, the recessed portion may include: a first recessed portion that is recessed from the rear surface and has a first width; and a second recessed portion that is connected to the first recessed portion and recessed from the first recessed portion in the thickness direction, and the light shielding pattern may fill the first recessed portion and the second recessed portion.

In an embodiment, a surface of the light shielding pattern, which is exposed from the rear surface of the base panel, may define the same plane with the rear surface of the base panel.

In an embodiment of the inventive concepts, an electronic apparatus includes: a window member having a front surface and a rear surface disposed opposite to the front surface in a thickness direction and including a base panel transmitting light therethrough and a light shielding pattern filled in a recessed portion defined in the base panel to block light; a display module disposed on the rear surface of the base panel and including a display panel having an active area for displaying an image and a peripheral area disposed adjacent to the active area and an optical member disposed on the display panel to overlap the active area and the peripheral area; and an electronic module disposed on the rear surface of the window member to overlap the active area. Here, the light shielding pattern is disposed along an edge of a module hole defined in the active area and passing through the display module, and a rear surface of the light shielding pattern is aligned with the rear surface of the base panel in a cross-sectional view.

In an embodiment, the light shielding pattern may have a thickness equal to or less than that of the base panel.

In an embodiment, the recessed portion may be defined as a through-hole passing through the base panel, the light shielding pattern may cover an inner surface of the through-hole, and at least a portion of the light shielding pattern may be exposed from the front surface of the base panel.

In an embodiment, the window member may further include a hole panel disposed in the through-hole to overlap the module hole, and the light shielding pattern may fill a gap between the hole panel and the base panel.

In an embodiment, the hole panel may contain the same material as the base panel.

In an embodiment, the hole panel may have a surface area equal to or greater than that of the module hole.

In an embodiment, the recessed portion may include: a first recessed portion recessed from the rear surface of the base panel and having a first width; and a second recessed portion recessed from the first recessed portion while being connected to the first recessed portion and having a second width less than the first width, and the light shielding pattern may fill the first recessed portion and the second recessed portion.

In an embodiment, a portion of the light shielding pattern, which is filled in the second recessed portion, may overlap an inner surface of the module hole in a plan view.

In an embodiment, the light shielding pattern may have an adhesion property.

In an embodiment, the electronic apparatus may further include a plurality of adhesion layers disposed between the display panel and the optical member and between the optical member and the window member.

In an embodiment, the display panel may include an organic light emitting element.

In an embodiment, the optical member may include a polarizing film.

In an embodiment, the window member may further include a bezel layer disposed on the rear surface of the base panel to overlap the peripheral area, and the light shielding pattern may be spaced apart from the bezel layer in a plan view.

In an embodiment, the electronic apparatus may further include an additional electronic module disposed to overlap the bezel layer, and the window member may further include an additional light shielding pattern disposed in an additional recessed portion defined in an area overlapping the bezel layer.

In an embodiment, the light shielding pattern may have a closed curve shape in a plan view.

In an embodiment, the base panel may further include a notch defined at one side thereof, and the light shielding pattern may cover an inner surface of the notch.

In an embodiment, the light shielding pattern may have a shape in which one portion is opened from a closed curve in a plan view.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts.

DETAILED DESCRIPTION

Figure 1A:
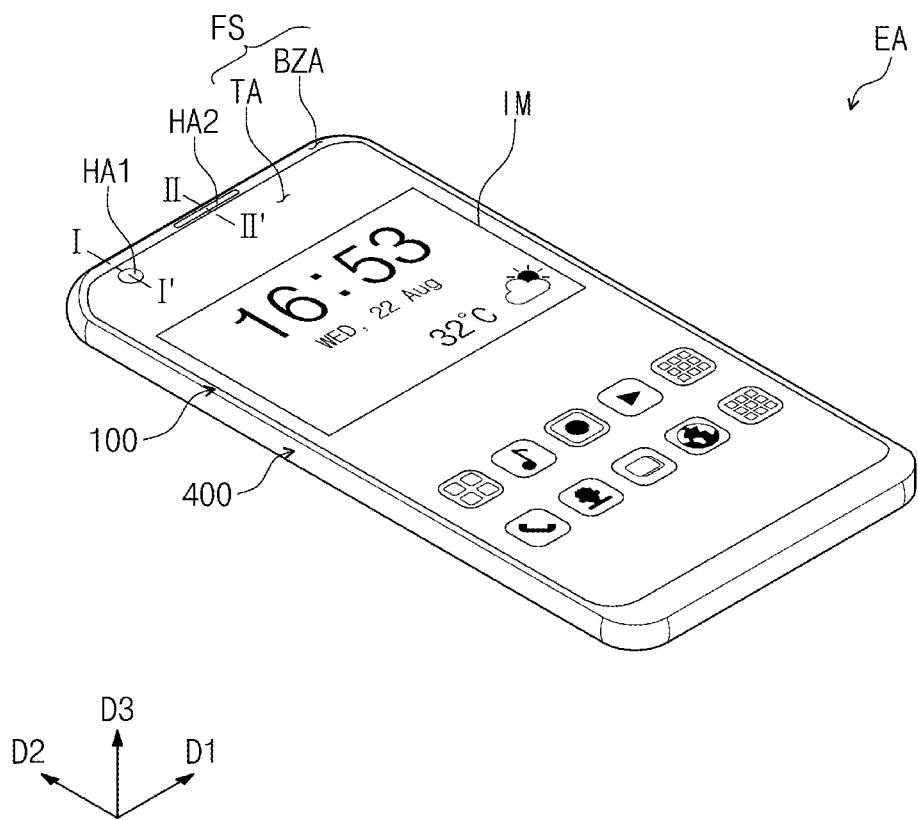
FIG. 1A is a coupled perspective view illustrating an electronic apparatus according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, regions, panels, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
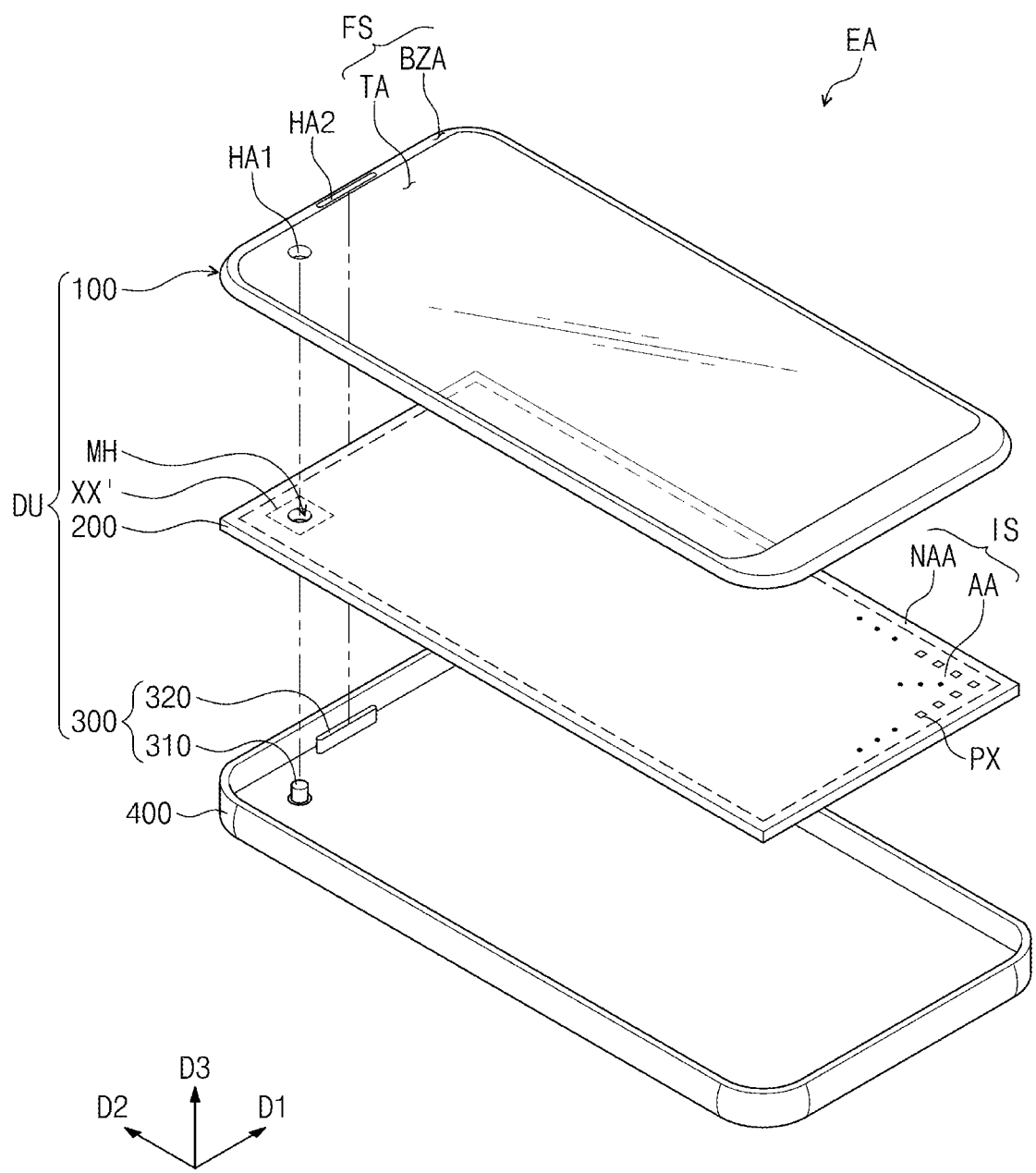
FIG. 1B is an exploded perspective view illustrating the electronic apparatus according to an exemplary embodiment of the inventive concepts.
Figure 2:
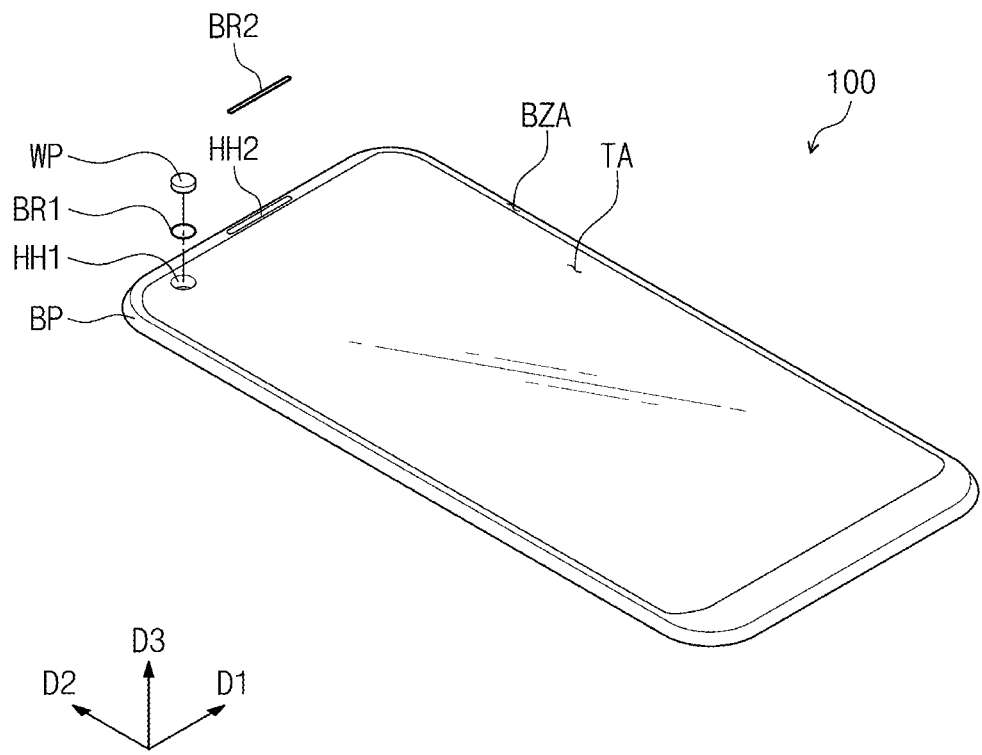
FIG. 2 is an exploded perspective view illustrating some of components in FIG. 1B.

FIG. 1A is a coupled perspective view illustrating an electronic apparatus according to an exemplary embodiment of the inventive concepts, and FIG. 1B is an exploded perspective view illustrating the electronic apparatus according to an exemplary embodiment of the inventive concepts. FIG. 2 is an exploded perspective view illustrating some of components illustrated in FIG. 1B. Hereinafter, an exemplary embodiment of the inventive concepts will be described with reference to FIGS. 1A, 1B, and 2.

An electronic apparatus EA displays an image IM in a third direction D3 in a plan view defined by a first direction D1 and a second direction D2. The electronic apparatus EA includes a window member 100, a display module 200, an electronic module 300, and a housing member 400. In the exemplary embodiment, the window member 100, the display module 200, and the electronic module 300 may be coupled to each other to constitute a display unit DU.

The window member 100 is disposed on the display module 200 to cover a front surface IS of the display module 200. The window member 100 includes a base panel BP, a first light shielding pattern BR1, a second light shielding pattern BR2, and a hole panel WP. The base panel BP may be optically clear. For example, the base panel BP may include glass or plastic. The base panel BP may have a single-layer or multi-layer structure. For example, the base panel BP may have a laminated structure in which a plurality of plastic films are coupled by means of an adhesive agent or a laminated structure in which a glass substrate and a plastic film are coupled by means of an adhesive agent.

The window member 100 includes a front surface FS that is exposed to the outside. An image displayed on the display module 200 is seen to the outside through the front surface FS. The front surface FS of the window may be divided into a transmission area TA and a bezel area BZA in a plan view.

The transmission area TA may be an area through which incident light is transmitted. The transmission area TA may have a shape corresponding to an active area AA. For example, the transmission area TA overlaps a front surface of or at least a portion of the active area AA. The image IM displayed on the active area AA of the display module 200 may be seen from the outside through the transmission area TA.

The bezel area BZA may have a relatively lower light transmittance than that of the transmission area TA. The bezel area BZA defines a shape of the transmission area TA. The bezel area BZA may be disposed adjacent to the transmission area TA to surround the transmission area TA.

The bezel area BZA may have a predetermined color. The bezel area BZA may cover a peripheral area NAA of the display module 200 to block the peripheral area NAA from being seen from the outside. However, exemplary embodiments of the inventive concepts are not limited thereto. For example, the bezel area BZA according to an exemplary embodiment of the inventive concepts may be omitted from the window member 100

Each of a first hole area HA1 and a second hole area HA2 may overlap an electronic module 300, which will be described later, in a plan view. The electronic module 300 may operate by receiving external signals provided through the first hole area HA1 and the second hole area HA2.

In the exemplary embodiment, the first hole area HA1 is defined in the transmission area TA, and the second hole area HA2 is defined in the bezel area BZA. However, exemplary embodiments of the inventive concepts are not limited thereto. For example, the first hole area HA1 and the second hole area HA2 may be defined in areas opposite to each other, respectively. Alternatively, all of the first hole area HA1 and the second hole area HA2 may be defined in the transmission area TA or in the bezel area BZA. Also, one of the first hole area HA1 and the second hole area HA2 may be omitted.

However, exemplary embodiments of the inventive concepts are not limited thereto. For example, the window member 100 may include various exemplary embodiments.

A predetermined recessed portion, which is recessed from a rear surface of the base panel BP, may be defined in each of the first hole area HA1 and the second hole area HA2. The recessed portion may include a groove having a depth less than a thickness of the base panel BP and a through-hole having a depth that is the same as the thickness of the base panel BP. In the embodiment, through-holes are exemplarily defined in the base panel BP.

A first hole HH1 is defined in the first hole area HAL and a second hole HH2 is defined in the second hole area HA2. Accordingly, the first hole HH1 may be defined in the transmission area TA, and the second hole HH2 may be defined in the bezel area BZA.

In the exemplary embodiment, the first hole HH1 and the second hole HH2 may have different shapes from each other. For example, the first hole HH1 may have a circular shape, and the second hole HH2 may have an oval shape having a major axis extending in the first direction D1. Each of the first hole HH1 and the second hole HH2 may have a shape corresponding to that of an overlapping component of the electronic module 300. Accordingly, each of the first hole HH1 and the second hole HH2 may have various shapes and sizes. However, the exemplary embodiments of the inventive concepts are not limited thereto.

The hole panel WP may be inserted into the hole defined in the base panel BP. In the exemplary embodiment, the hole panel WP is disposed in the first hole HH1. Accordingly, the hole panel WP has a circular shape corresponding to the shape of the first hole HH1. However, exemplary embodiments of the inventive concepts are not limited thereto. For example, the hole panel WP according to an exemplary embodiment of the inventive concepts may have a shape corresponding to that of the second hole HH2 and be disposed in the second hole HH2. Also, the hole panel WP may be omitted from the electronic apparatus EA according to an exemplary embodiment of the inventive concepts.

The first light shielding pattern BR1 covers an inner surface of the first hole HH1. The first light shielding pattern BR1 may have a circular ring shape corresponding to the shape of the first hole HH1. The first light shielding pattern BR1 and the hole panel WP may be inserted together into the first hole HH1. The first light shielding pattern BR1 may fill a space between a circumference of the hole panel WP and the inner surface of the first hole HH1.

The first light shielding pattern BR1 may have an adhesion property. Accordingly, the first light shielding pattern BR1 may physically couple the hole panel WP to the base panel BP. The first light shielding pattern BR1 may have a color having a high light shielding property. For example, the first light shielding pattern BR1 may have a black color or a color having a high light absorption rate.

The second light shielding pattern BR2 covers an inner surface of the second hole HH2. The second light shielding pattern BR2 may have an elliptical ring shape corresponding to the shape of the second hole HH2. In the embodiment, unlike the first hole HH1, an additional component such as the hole panel WP may not be inserted into the second hole HH2. Accordingly, the second light shielding pattern BR2 may be exposed to the outside. The second light shielding pattern BR2 may contain a material having a high light shielding property. The second hole HH2 may have an inner surface that is substantially coated with the second light shielding pattern BR2 in a light shielding manner.

The display module 200 displays the image IM on the front surface IS. The front surface IS may be divided into an active area AA and a peripheral area NAA. The image IM is displayed on the active area AA. The peripheral area NAA is disposed adjacent to the active area AA.

The display module 200 may include a plurality of pixels PX. The pixels PX display light in response to an electric signal. The light displayed by the pixels PX realizes the image IM.

In the embodiment, a predetermined through-hole passing through the display module 200 may be defined in the display module 200. A module hole MH may be defined in the active area AA of the display module 200.

The module hole MH overlaps the first hole area HA1. The module hole MH is defined in the active area AA. Accordingly, some of the pixels PX may be arranged to surround the module hole MH. The image IM is displayed on an area disposed adjacent to the module hole MH.

The electronic module 300 includes various functional modules for operating the electronic apparatus EA. The electronic module 300 may be electrically connected to the display module 200 through a connector (not shown). For example, the electronic module 300 may include a camera, a speaker, or a sensor for detecting light or heat.

For example, the electronic module 300 may include a first electronic module 310 and a second electronic module 320. The first electronic module 310 may detect an external object that is received through the module hole MH and the first hole area HA1. The first electronic module 310 may receive an external input that is transmitted through the module hole MH and the first hole area HA1 or provide an output through the module hole MH and the first hole area HA1.

For example, the first electronic module 310 may be one of a light emitting module, a light detecting module, and a photographing module. For example, the first electronic module 310 may include at least one of a light emitting module emitting infrared rays, a CMOS sensor for detecting infrared rays, and a camera module for photographing an external object.

The second electronic module 320 may collect a sound signal such as voice through the second hole area HA2 or provide a sound signal such as processed voice to the outside. For example, the second electronic module 320 may include at least one of a sound input module and a sound output module. The sound input module may include a microphone capable of receiving a sound signal. The sound output module may include a speaker that outputs sound data into a sound signal.

However, exemplary embodiments of the inventive concepts are not limited thereto. For example, the electronic module 300 may include a single module and further include the more number of electronic modules, and the electronic modules may be arranged in various arrangement relationships.

The housing member 400 is disposed below the display module 200. The housing member 400 may be coupled to the window member 100 to provide an outer shape of the electronic apparatus EA. The housing member 400 may contain a material having a relatively high rigidity. For example, the housing member 400 may include a plurality of frames and/or plates, which are/is made of glass, plastic, and/or metal.

The housing member 400 provides a predetermined accommodation space. The display module 200 and the electronic module 300 may be accommodated in the accommodation space and protected from an external impact.

According to an exemplary embodiment of the inventive concepts, a portion of the electronic module 300 may overlap the active area AA of the display module 200 and the transmission area TA of the window member 100. Accordingly, the bezel area BZA may decrease in area to improve an esthetic sense of the electronic apparatus EA.

Figure 3A:
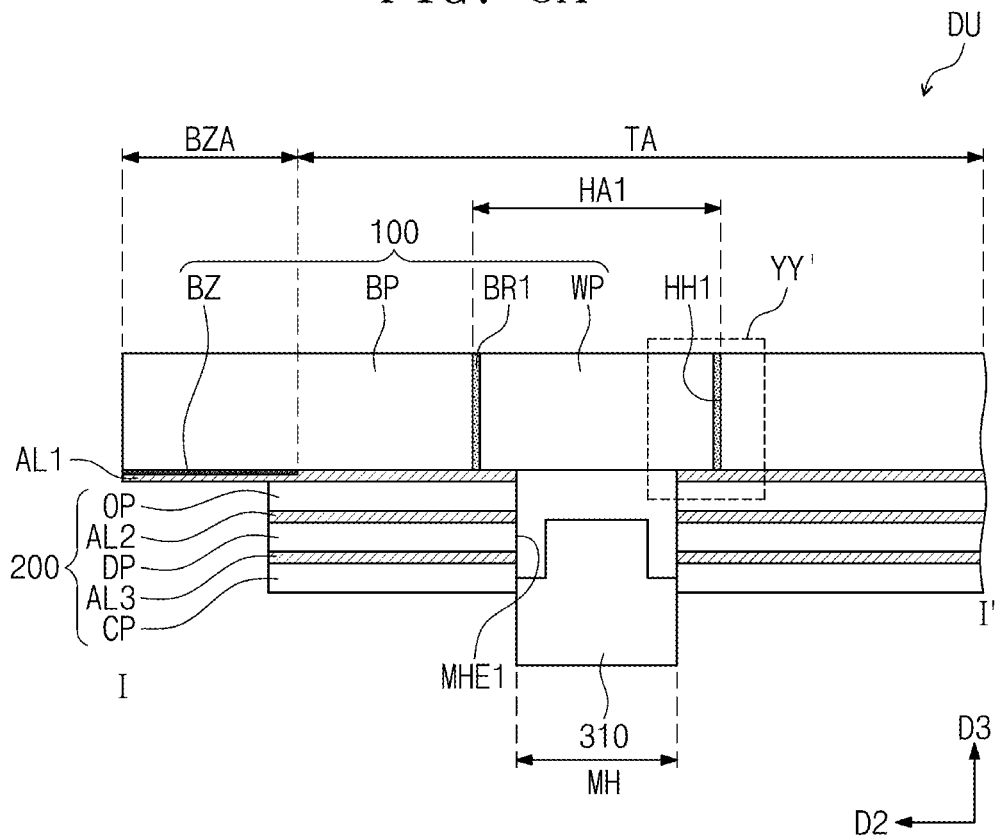
FIGS. 3A and 3B are cross-sectional views illustrating the electronic apparatus in FIG. 1A.
Figure 3B:
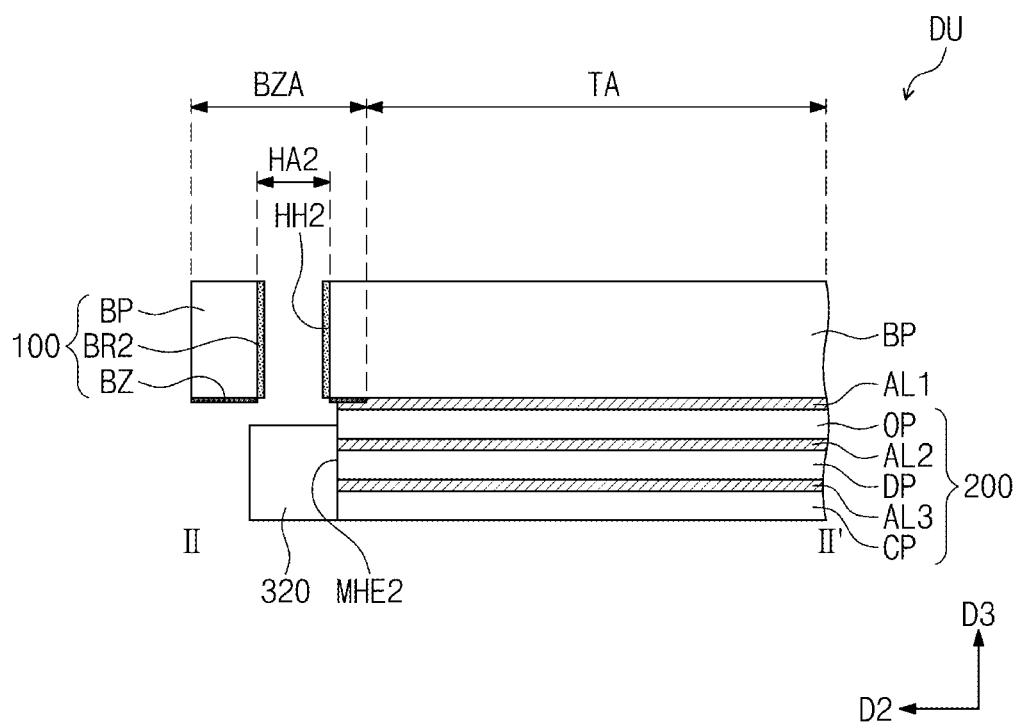

FIGS. 3A and 3B are cross-sectional views illustrating the electronic apparatus in FIG. 1A. FIG. 3A is a cross-sectional view taken along line I-I' in FIG. 1A, and FIG. 3B is a cross-sectional view taken along line II-II' in FIG. 1A. Here, the housing member 400 (refer to FIG. 1A) is omitted for ease of description. That is, FIGS. 3A and 3B are partial cross-sectional views of the display unit DU. Hereinafter, an exemplary embodiment of the inventive concepts will be described with reference to FIGS. 3A and 3B.

As illustrated in FIGS. 3A and 3B, the display unit DU includes the window member 100, the display module 200, the first electronic module 310, and the second electronic module 320. In the exemplary embodiment, a first adhesion member AL1 may be disposed between the window member 100 and the display module 200. The first adhesion member AL1 physically couples the window member 100 to the display module 200. The first adhesion member AL1 may contain a transparent adhesion material. For example, the first adhesion member AL1 may include at least one of an optical clear adhesive (OCA), an optical clear resin (OCR), and a pressure sensitive adhesive (PSA).

The window member 100 may further include a bezel layer BZ. The bezel layer BZ defines the bezel area BZA. In the exemplary embodiment, an area of the base panel BP, on which the bezel layer BZ is disposed, may be defined as the bezel area BZA, and an area of the base panel BP, which is exposed from the bezel layer BZ may be defined as the transmission area TA.

The display module 200 includes a display panel DP, an optical member OP, a cover panel CP, a second adhesion member AL2, and a third adhesion member AL3. The second adhesion member AL2 is disposed between the display panel DP and the optical member OP and couples the display panel DP to the optical member OP. The third adhesion member AL3 is disposed between the display panel DP and cover panel CP and couples the display panel DP to the cover panel CP.

Each of the second adhesion member AL2 and the third adhesion member AL3 may contain a transparent adhesion material. For example, each of the second adhesion member AL2 and the third adhesion member AL3 may include at least one of an optical clear adhesive (OCA), an optical clear resin (OCR), and a pressure sensitive adhesive (PSA).

The display panel DP displays the image IM (refer to FIG. 1A) in response to an electric signal. In the exemplary embodiment, the display panel DP may be a front light emitting display panel that displays the image IM in the third direction D3.

The optical member OP is disposed on a front surface of the display panel DP. The optical member OP may decrease an external light reflectance of the display panel DP with respect to the light incident into the display panel DP. For example, the optical member OP may include at least one of a reflection preventing film, a polarizing film, a color filter, and a gray filter.

The cover panel CP is disposed on a rear surface of the display panel DP. The cover panel CP may protect the display panel DP against an external impact or reduce a thermal effect, which affects the display panel DP. For example, the cover panel CP may include at least one of a sponge, a plastic panel, a metal panel, and a heat dissipation film.

The display module 200 includes a first end MHE1 and a second end MHE2. The first end MHE1 overlaps the first hole area HA1. The first end MHE1 defines an inner surface of the module hole MH.

The second end MHE2 defines a side surface of the display module 200. The second end MHE2 may overlap the bezel area BZA. The bezel layer BZ overlaps the second end MHE2 in a plan view. However, exemplary embodiments of the inventive concepts are not limited thereto. For example, the second end MHE2 may be aligned with side surfaces of the window member 100 or overlap the transmission area TA.

In FIG. 3A, a portion on which the first hole area HA1 is disposed is illustrated. As illustrated in FIG. 3A, the hole panel WP and the first light shielding pattern BR1 are disposed in the first hole HH1. The first light shielding pattern BR1 is inserted between the hole panel WP and the base panel BP. Accordingly, a width of the first hole area HA1 in the second direction D2 may correspond to a sum of a width of the first light shielding pattern BR1 in the second direction D2 and a width of the hole panel WP in the second direction D2. The hole panel WP stably protect the first electronic module 310 from external pollution or external impact.

The first hole area HA1 overlaps the first electronic module 310. In the embodiment, the first electronic module 310 is inserted into the module hole MH. However, exemplary embodiments of the inventive concepts are not limited thereto. For example, the first electronic module 310 may be disposed outside the module hole MH while overlapping the module hole MH.

As described above, the external signal provided through the first hole area HA1 is provided to the first electronic module 310 through the module hole MH. The first electronic module 310 processes the provided external signal to provide an electric signal to the display module 200. For example, the first electronic module 310 may be one of a light emitting module, a light detecting module, and a photographing module.

In FIG. 3B, a portion on which the second hole area HA2 is disposed is illustrated. As described above, the second hole area HA2 is defined in the bezel area BZA. As illustrated in FIG. 3B, the second light shielding pattern BR2 is disposed in the second hole HH2. The second light shielding pattern BR2 covers an inner surface of the second hole HH2 in base panel BP.

The second end MHE2 of the display module may overlap the bezel area BZA. The second electronic module 320 is disposed adjacent to the second end MHE2. The second electronic module 320 may receive an external signal provided through the second hole area HA2 or provide a processed signal to the outside. In the exemplary embodiment, the second electronic module 320 may include at least one of a sound input module and a sound output module.

In the display unit DU according to the exemplary embodiment, the hole panel WP disposed in the second hole area HA2 may be omitted. That is, the second light shielding pattern BR2 may be exposed to the outside. Accordingly, an input efficiency for receiving the external signal provided to the second electronic module 320 or an output efficiency for providing the processed signal to the outside may be improved. However, exemplary embodiments of the inventive concepts are not limited thereto. For example, the hole panel WP may be provided in the second hole area HA2.

Figure 4A:
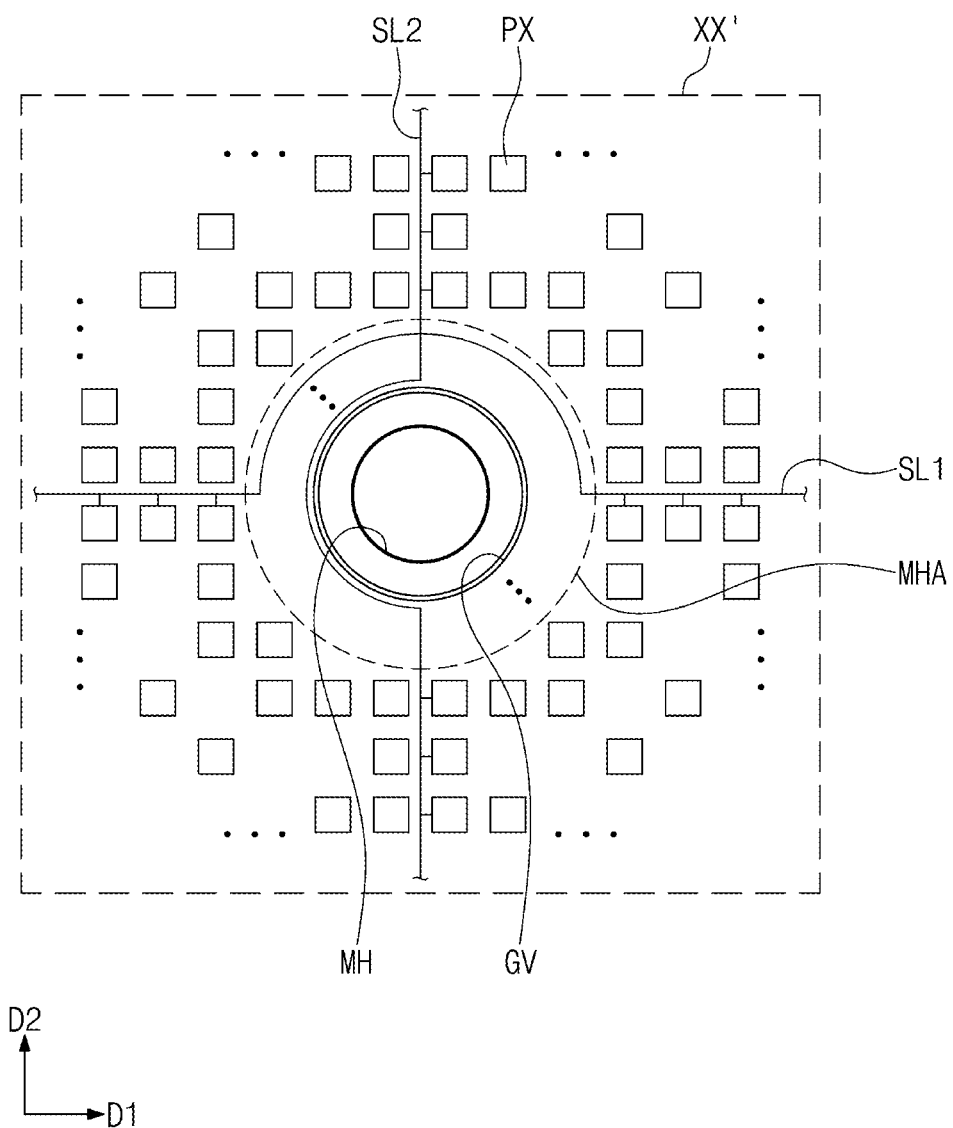
FIG. 4A is an enlarged plan view schematically illustrating an area XX' in FIG. 1B.
Figure 4B:
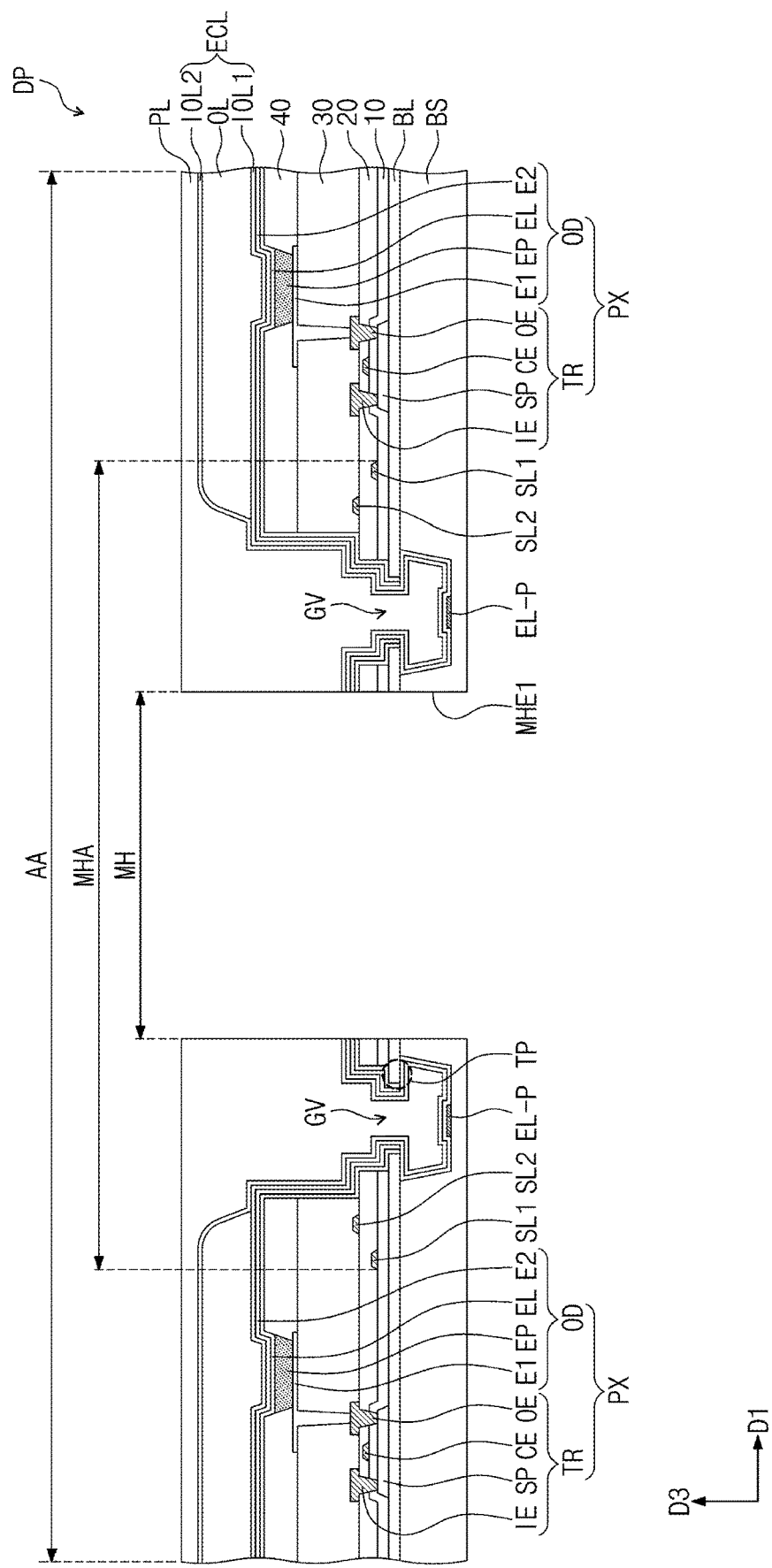
FIGS. 4B and 4C are cross-sectional views illustrating a portion of a display panel according to an exemplary embodiment of the inventive concepts.
Figure 4C:
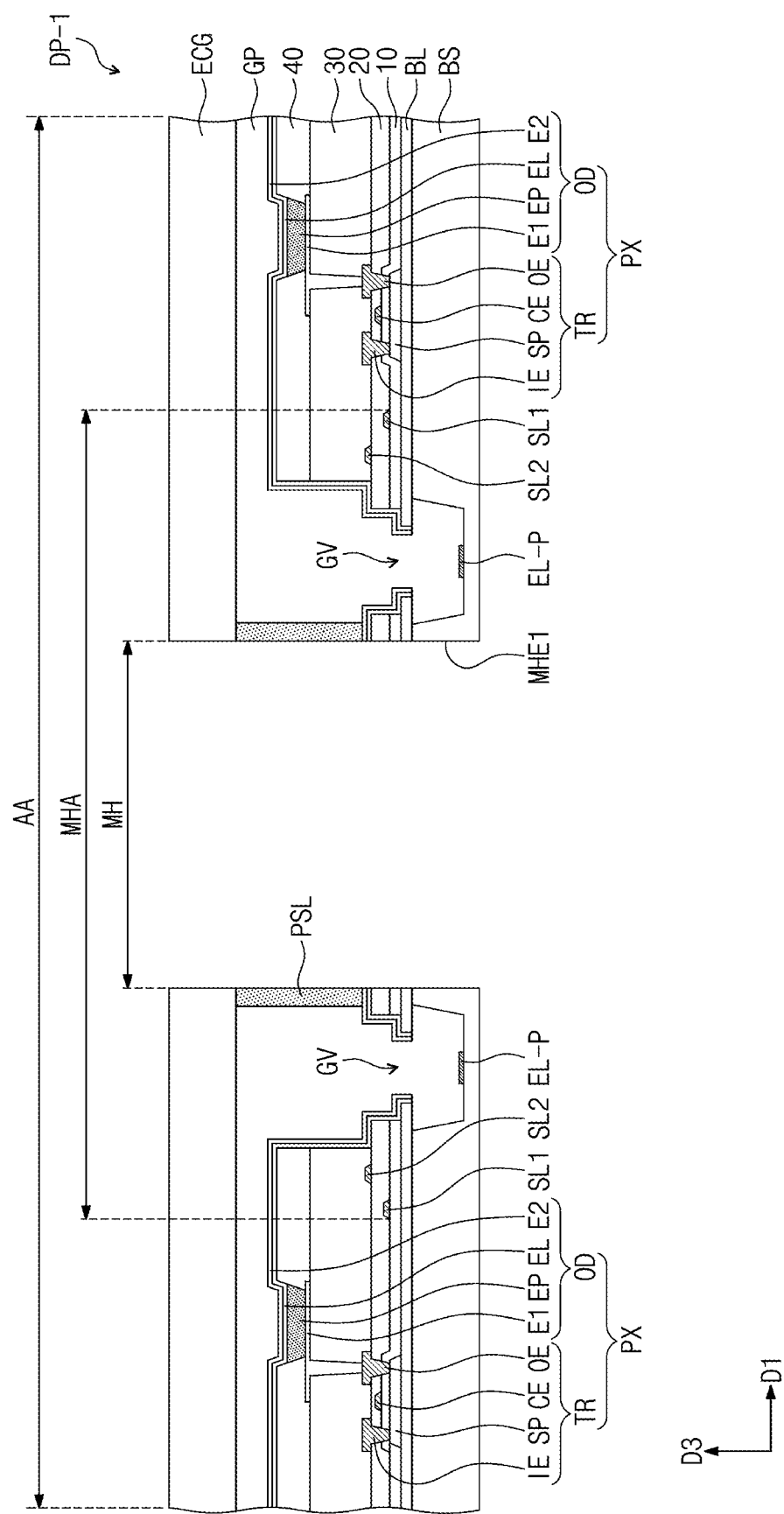

FIG. 4A is an enlarged plan view schematically illustrating an area XX' in FIG. 1B. FIGS. 4B and 4C are cross-sectional views illustrating a portion of the display panel according to an exemplary embodiment of the inventive concepts. FIGS. 4B and 4C may substantially correspond to the cross-sectional views of the area XX'. Hereinafter, an exemplary embodiment of the inventive concepts will be described with reference to FIGS. 4A, 4B, and 4C. Meanwhile, the same elements as those described in FIGS. 1A to 3B are designated by the same reference symbols, and overlapping descriptions will be omitted.

Referring to FIGS. 4A and 4B, the display panel DP includes a base layer BS, a plurality of signal lines SL1 and SL2, a plurality of pixels PX, an encapsulation layer ECL, and a planarization layer PL. The base layer BS may contain an insulating material. For example, the base layer BS may include glass, a resin film, or a laminated film in which an organic layer and an inorganic layer are alternately laminated.

Each of the pixels PX generates light to realize the image IM (refer to FIG. 1A) on the active area AA. Each of the pixels PX may be connected to a plurality of signal lines. In the embodiment, a first signal line SL1 and a second signal line SL2 of the signal lines are exemplarily described. However, exemplary embodiments of the inventive concepts are not limited thereto. For example, each of the pixels PX according to an exemplary embodiment of the inventive concepts may be additionally connected to various signal lines. Hereinafter, the pixel PX will be described with reference to one pixel PX.

The pixels PX are disposed on the base layer BS. In the exemplary embodiment, an auxiliary layer BL may be disposed between the pixels PX and the base layer BS. The auxiliary layer BL may be directly provided on the base layer BS to cover a front surface of the base layer BS.

The auxiliary layer BL contains an inorganic material. The auxiliary layer BL may include a barrier layer and/or a buffer layer. Accordingly, the auxiliary layer BL prevents oxygen or moisture, which is introduced through the base layer BS, from being permeated into the pixels PX or provides surface energy less than that of the base layer BS so that the pixels PX are stably provided.

Here, at least one of the base layer BS and the auxiliary layer BL may be provided in plurality and alternately laminated. Also, at least one of the barrier layer and the buffer layer of the auxiliary layer BL may be provided in plurality or omitted. However, exemplary embodiments of the inventive concepts are not limited thereto. For example, the display panel DP according to an exemplary embodiment of the inventive concepts may have various structures.

The pixel PX may include a thin-film transistor TR and a display element OD. The thin film transistor TR includes a semiconductor pattern SP, a control electrode CE, an input electrode IE, and an output electrode OE. The semiconductor pattern SP is disposed on the auxiliary layer BL. The semiconductor pattern SP may contain a semiconductor material. The control electrode CE is spaced apart from the semiconductor pattern SP with a first insulation layer 10 therebetween.

Each of the input electrode IE and the output electrode OE is spaced apart from the control electrode CE with a second insulation layer 20 therebetween. The input electrode IE and the output electrode OE of the thin-film transistor TR pass through the first insulation layer 10 and the second insulation layer 20 and are connected to one side and the other side of the semiconductor pattern SP, respectively.

A third insulation layer 30 is disposed on the second insulation layer 20 to cover the input electrode IE and the output electrode OE. Alternatively, in an exemplary embodiment of the inventive concepts, the semiconductor pattern SP may be disposed on the control electrode CE. Also, the semiconductor pattern SP may be disposed on the input electrode IE and the output electrode OE. Also, the input electrode IE and the output electrode OE may be disposed on the same layer as the semiconductor pattern SP and directly connected to the semiconductor pattern SP. As described above, the thin-film transistor TR according to an exemplary embodiment of the inventive concepts may have various structures. However, exemplary embodiments of the inventive concepts are not limited thereto.

The display element OD is disposed on the third insulation layer 30. The display element OD may include various elements as long as the elements are able to display light. For example, the display element OD may include an organic light emitting element, an electrophoretic element, an electrowetting element, and a liquid crystal capacitor. In the embodiment, the display element OD is exemplarily described as an organic light emitting element. The display element OD includes a first electrode E1, a light emitting pattern EP, a control layer EL, and a second electrode E2.

The first electrode E1 may pass through the third insulation layer 30 and be connected to the thin-film transistor TR. Although not shown, the display panel DP may further include an additional connecting electrode disposed between the first electrode E1 and the thin-film transistor TR. Here, the first electrode E1 may be electrically connected to the thin-film transistor TR through the connecting electrode.

A fourth insulation layer 40 is disposed on the third insulation layer 30. The fourth insulation layer 40 may contain an organic material and/or an inorganic material and have a single-layer or multi-layer structure.

An opening may be defined in the fourth insulation layer 40. The opening exposes at least a portion of the first electrode E1. The fourth insulation layer 40 may be a pixel defining layer.

The light emitting pattern EP may be disposed in the opening and disposed on the first electrode E1, which is exposed by the opening. The light emitting pattern EP may contain a light emitting material. For example, the light emitting pattern EP may be made of at least one of materials emitting red light, green light, and blue light, respectively, and contain a fluorescent material or a phosphorescent material. The light emitting pattern EP may contain an organic light emitting material or an inorganic light emitting material. The light emitting pattern EP may emit light in response to a potential difference between the first electrode E1 and the second electrode E2.

The control layer EL is disposed between the first electrode E1 and the second electrode E2. The control layer EL is disposed adjacent to the light emitting pattern EP. The control layer EL controls transfer of an electric charge to improve a light emitting efficiency and lifespan of the display element OD. The control layer EL may include at least one of a hole transporting material, a hole injecting material, an electron transporting material, and an electron injecting material.

In the exemplary embodiment, the control layer EL is disposed between the light emitting pattern EP and the second electrode E2. However, exemplary embodiments of the inventive concepts are not limited thereto. For example, the control layer EL may be disposed between the light emitting pattern EP and the first electrode E1 or may include a plurality of layers that are laminated with the light emitting pattern EP therebetween in the third direction D3. Alternatively, the control layer EL may be omitted from the display element OD according to an exemplary embodiment of the inventive concepts.

The control layer EL may have an integrated shape extending from the active area AA to the peripheral area NAA. The control layer EL may be provided in common to the plurality of pixels.

The second electrode E2 is disposed on the control layer EL. The second electrode E2 may face the first electrode E1. The second electrode E2 may have an integrated shape extending from the active area AA to the peripheral area NAA. The second electrode E2 may be provided in common to the plurality of pixels. The display element OD disposed on each of the pixels receives a common power voltage (hereinafter, referred to as a second power voltage) through the second electrode E2.

The second electrode E2 may contain a transmissive conductive material or a semi-transmissive conductive material. Accordingly, light emitted from the light emitting pattern EP may be easily emitted through the second electrode E2 in the third direction D3. However, exemplary embodiments of the inventive concepts are not limited thereto. For example, according to design of the display element OD according to an exemplary embodiment of the inventive concepts, the first electrode E1 may be driven by a rear light emitting method including a transmissive or a semi-transmissive material or by a both surface light emitting method that emit light toward both front and rear surfaces.

The encapsulation layer ECL is disposed on the display element OD to encapsulate the display element OD. The encapsulation layer ECL may be provided in common to the plurality of pixels. Although not shown, a capping layer covering the second electrode E2 may be further disposed between the second electrode E2 and the encapsulation layer ECL.

The encapsulation layer ECL may include a first inorganic layer IOL1, an organic layer OL, and a second inorganic layer IOL2, which are sequentially laminated in the third direction D3. However, exemplary embodiments of the inventive concepts are not limited thereto. For example, the encapsulation layer ECL may further include a plurality of inorganic layers and a plurality of organic layers.

The first inorganic layer IOL1 may cover the second electrode E2. The first inorganic layer IOL1 may prevent external moisture or oxygen from being permeated into the display element OD. For example, the first inorganic layer IOL1 may contain a silicon nitride, a silicon oxide, or a combination thereof. The first inorganic layer IOL1 may be formed through a deposition process.

The organic layer OL may be disposed on the first inorganic layer IOL1 to contact the first inorganic layer IOL1. The organic layer OL may provide a planarization surface on the first inorganic layer IOL1. The organic layer OL may cover curved portions of a top surface of the first inorganic layer IOL1 or particles existing on the first inorganic layer IOL1 to prevent a surface state of the top surface of the first inorganic layer IOL1 from affecting components provided on the organic layer OL. Also, the organic layer OL may relieve a stress between layers contacting each other. The organic layer OL may contain an organic material and be formed through a solution process such as spin coating, slit coating, and an inkjet process.

The second inorganic layer IOL2 is disposed on the organic layer OL to cover the organic layer OL. The second inorganic layer IOL2 may be relatively stably formed on a flat surface of the organic layer OL rather than being disposed on the first inorganic layer IOL1. The second inorganic layer IOL2 encapsulates moisture or the like discharged from the organic layer OL to prevent the discharged moisture or the like from being introduced to the outside. The second inorganic layer IOL2 may contain a silicon nitride, a silicon oxide, or a combination thereof. The second inorganic layer IOL2 may be formed through a deposition process.

A planarization layer PL may be disposed on the encapsulation layer ECL. The planarization layer PL covers a front surface of the encapsulation layer ECL, which provides a non-uniform front surface, to provide a planarization surface to the active area AA. The above-described optical member OP (refer to FIG. 3A) may be disposed on the planarization layer PL. However, exemplary embodiments of the inventive concepts are not limited thereto. For example, in the display panel DP according to an exemplary embodiment of the inventive concepts, the planarization layer PL may be provided in plurality or omitted.

As illustrated in FIG. 4C, a display panel DP-1 may include an encapsulation substrate ECG. Here, the encapsulation layer ECL may be omitted. The encapsulation substrate ECG may contain an insulating material. For example, the encapsulation substrate ECG may include a glass substrate or a plastic substrate. The above-described optical member OP may be disposed on the encapsulation substrate ECG. The display panel DP-1 according to an exemplary embodiment of the inventive concepts may have improved reliability with respect to an external impact by including the encapsulation substrate ECG.

The encapsulation substrate ECG may be spaced a predetermined distance from a second electrode E2 in the third direction D3. Air or an inert gas may be filled in a space GP between the encapsulation substrate ECG and the second electrode E2.

The encapsulation substrate ECG is coupled to a base layer BS through a sealing member PSL to seal a pixel PX. The encapsulation substrate ECG may be disposed on the base layer BS while spaced a predetermined distance by the sealing member PSL.

The sealing member PSL may define an inner surface of a module hole MH. The sealing member PSL may contain an organic material such as a photo-curable resin or a photo-setting resin or an inorganic material such as frit seal.

Although not shown, the display panel DP-1 may further include an input sensing unit for detecting an external input. The input sensing unit includes a sensor for detecting an external touch, heat, light, pressure, and the like. The input sensing unit may be disposed on the encapsulation layer ECL, on the planarization layer PL, or the encapsulation substrate ECG. However, exemplary embodiments of the inventive concepts are not limited thereto. For example, the input sensing unit may be disposed in the display panel DP or disposed on a rear surface of the base layer BS while being disposed between the base layer BS and the pixels PX.

As previously described, the module hole MH is defined in the active area AA. Accordingly, some of the pixels PX may be arranged along an edge of the module hole MH. In the exemplary embodiment, the module hole MH passes through the base layer BS, the auxiliary layer BL, the first insulation layer 10, the second insulation layer 20, the control layer, the first inorganic layer IOL1, the second inorganic layer IOL2, and the planarization layer PL. Accordingly, the first end MHE1 may include perforated cross-sections of the base layer BS, the auxiliary layer BL, the first insulation layer 10, the second insulation layer 20, the control layer EL, the first inorganic layer IOL1, the second inorganic layer IOL2, and the planarization layer PL.

Some of the signal lines SL1 and SL2 may be disposed on the hole area MHA. In FIGS. 4A and 4B, the first signal line SL1 and the second signal line SL2 of the plurality of signal lines SL1 and SL2 are exemplarily illustrated.

The first signal line SL1 extends in the second direction D2. The first signal line SL1 is connected to pixels of the pixels PX, which are arranged in the same row in the second direction D2. For example, the first signal line SL1 may correspond to a gate line. The first signal line SL1 provides a gate signal, which turns-on the pixels PX, to the corresponding pixels.

With respect to the module hole MH, some of the pixels connected to the first signal line SL1 are disposed on the left side, and the others thereof are disposed on the right side. Accordingly, the pixels connected to the first signal line SL1 in the same row may be substantially turned-on/off by the same gate signal although some of the pixels are omitted with respect to the module hole MH.

The first signal line SL1 may be disposed on the same layer as the control electrode CE of the thin-film transistor TR. Although the first signal line SL1 is disposed between the first insulation layer 10 and the second insulation layer, exemplary embodiments of the inventive concepts are not limited thereto. For example, the first signal line SL1 may be disposed on a different layer from the control electrode CE of the first signal line SL1.

The second signal line SL2 extends in the first direction D1. The second signal line SL2 is connected to pixels of the pixels PX, which are arranged in the same row in the first direction D1. For example, the second signal line SL2 may correspond to a data line. The second signal line SL2 provides a data signal to the corresponding pixels.

The second signal line SL2 may be disposed on a different layer from the first signal line SL1. For example, the second signal line SL2 may be disposed on the same layer as the input electrode IE or the output electrode OE of the thin-film transistor TR. In the embodiment, the second signal line SL2 is disposed between the second insulation layer 20 and the third insulation layer 30.

With respect to the module hole MH, some of the pixels connected to the second signal line SL2 are disposed on the upper side, and the others thereof are disposed on the lower side. Accordingly, the pixels connected to the second signal line SL2 in the same row may receive the data signal through the same line although some of the pixels are omitted with respect to the module hole MH.

In the display panel DP according to an exemplary embodiment of the inventive concepts, the first signal line SL1 may correspond to the data line, and the second signal line SL2 may correspond to the gate line. Also, each of the first signal line SL1 and the second signal line SL2 may be one of a power line, an initialization voltage line, and a light emitting control line. Also, although not shown, each of the pixels PX may be further connected to additional signal lines (not shown). However, exemplary embodiments of the inventive concepts are not limited thereto.

The display panel DP according to the exemplary embodiment may further include a recessed pattern GV defined in the hole area MHA. The recessed pattern GV may be defined along an edge of the module hole MH. In the exemplary embodiment, the recessed pattern GV is a closed curve surrounding the module hole MH and has a circular shape similar to that of the module hole MH. However, exemplary embodiments of the inventive concepts are not limited thereto. For example, the recessed pattern GV may have a different shape from the module hole MH, a closed curve shape including a polygon, an oval, or at least a portion of a curve, or a shape including a plurality of patterns that are partially disconnected.

The recessed pattern GV, which is a pattern recessed from a front surface of the display panel DP, may be formed by removing some of components of the display panel DP. However, the recessed pattern GV does not pass through the display panel DP unlike the module hole MH. Accordingly, the rear surface of the base layer BS, which overlaps the recessed pattern GV, is not opened by the recessed pattern GV.

The recessed pattern GV may be formed by passing through components, which are disposed adjacent to the module hole MH, of the rest components disposed below the encapsulation layer ECL, except for only a portion of the base layer B S. In the exemplary embodiment, the recessed pattern GV may be formed by connecting a through-portion defined in the auxiliary layer BL and a recessed portion defined in the base layer BS. An inner surface of the recessed pattern GV may be formed such that the through-portion defined in the auxiliary layer BL and the recessed portion defined in the base layer BS are covered by the first inorganic layer IOL1 and the second inorganic layer IOL2. In the exemplary embodiment, the second inorganic layer IOL2 may provide the inner surface of the recessed pattern GV.

Also, the recessed pattern GV may have an under-cut shape including a tip TP (see FIG. 4B) protruding toward an inside thereof. In the embodiment, the tip TP may be formed such that a portion of the auxiliary layer BL protrudes toward the inside of the recessed pattern GV more than the base layer BS. The display panel DP according to an exemplary embodiment of the inventive concepts may have various layer structures as long as the tip may be formed on the recessed pattern GV. However, exemplary embodiments of the inventive concepts are not limited thereto.

The display panel DP may further include a predetermined organic pattern EL-P disposed in the recessed pattern GV. The organic pattern EL-P may contain the same material as the control layer EL. Alternatively, the organic pattern EL-P may contain the same material as the second electrode E2 or the capping layer (not shown). The organic pattern EL-P may have a single-layer or multi-layer structure.

The organic pattern EL-P may be disposed in the recessed pattern GV while being spaced apart from the control layer EL and the second electrode E2. The organic pattern EL-P may not be exposed to the outside by being covered by the first inorganic layer IOL1, as illustrated in FIG. 4B.

According to an exemplary embodiment of the inventive concepts, the recessed pattern GV blocks continuity of the control layer EL that is connected from a side surface of the module hole MH to the active area AA. The control layer EL may be disconnected in an area overlapping the recessed pattern GV. The control layer EL may be a movement path of an external pollutant such as moisture or air. A layer exposed by the module hole MH, e.g., a path through which moisture or air, which may be introduced from the control layer EL, passes through the hole area MHA and are introduced into the pixel PX may be blocked by the recessed pattern GV. Accordingly, the display panel DP in which the module hole MH is defined may be improved in reliability.

In the display panel DP according to an exemplary embodiment of the inventive concepts, the recessed pattern GV may be provided in plurality, and the plurality of recessed patterns may be spaced apart from each other in the hole area MHA. Alternatively, the recessed pattern GV may be filled with a portion of the organic layer OL. Alternatively, in the display panel DP according to an exemplary embodiment of the inventive concepts, the recessed pattern GV may be omitted. However, exemplary embodiments of the inventive concepts are not limited thereto.

According to an exemplary embodiment of the inventive concepts, the module hole MH passes through the display panel DP. The inner surface of the module hole MH may be defined by perforated cross-sections of a plurality of components of the display panel DP.

Figure 5A:
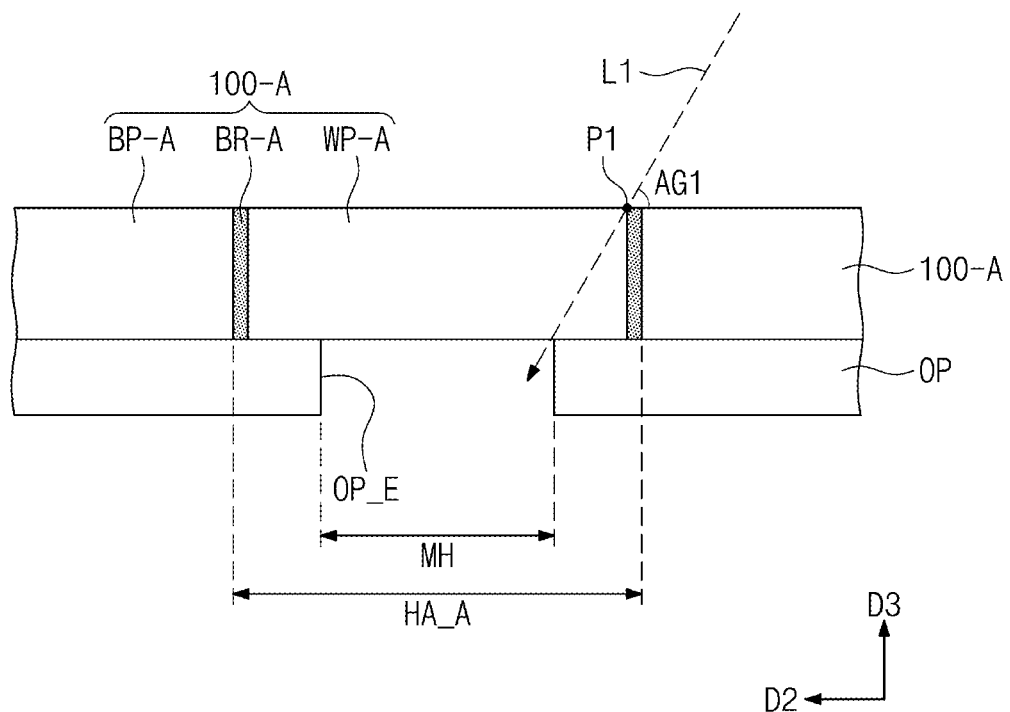
FIGS. 5A, 5B, and 5C are cross-sectional views illustrating a portion of a display apparatus according to an exemplary embodiment of the inventive concepts.
Figure 5B:
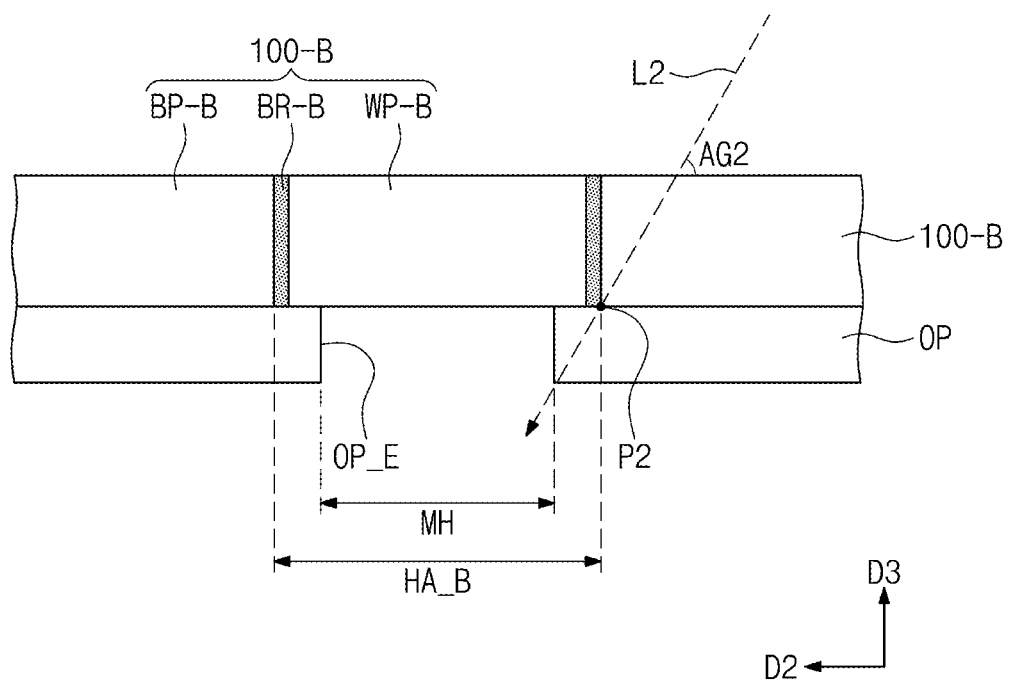
Figure 5C:
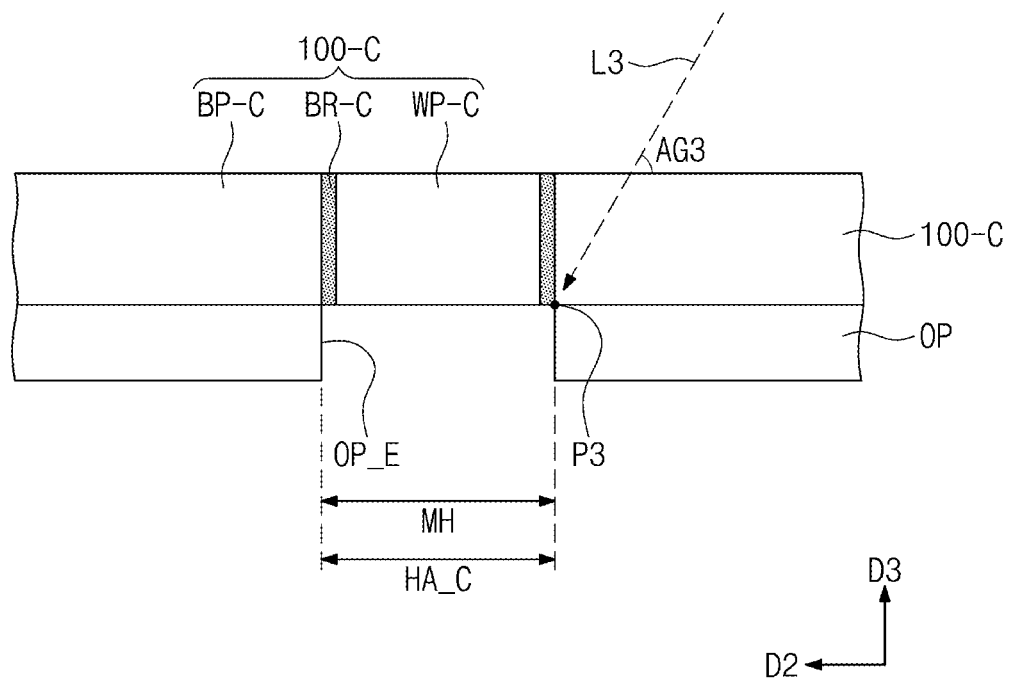

FIGS. 5A, 5B, and 5C are cross-sectional views illustrating a portion of a display apparatus according to an exemplary embodiment of the inventive concepts. In FIGS. 5A to 5C, only an optical member OP and a window member 100-A, 100-B, and 100-C are illustrated in an area corresponding to FIG. 3A for ease of description. Also, a light path corresponding to a user's view is illustrated as an arrow for ease of description. Hereinafter, an exemplary embodiment of the inventive concepts will be described with reference to FIGS. 5A to 5C. Meanwhile, the same elements as those described in FIGS. 1A to 4C are designated by the same reference symbols, and overlapping description will be omitted.

As illustrated in FIG. 5A, the window member 100-A includes a base panel BP-A, a light shielding pattern BR-A, and a hole panel WP-A. The optical member OP, in which the module hole MH is defined, includes an end OP_E defining an inner surface of the module hole MH. When light L1 (hereinafter, referred to as first light) corresponding to the user's view is incident at an angle of a first angle AG1 into the window member 100-A, the first light L1 passes an uppermost point P1 (hereinafter, referred to as a first point) of the light shielding pattern BR-A, which contacts the hole panel WP-A, and passes through the window member 100-A.

Here, the first light L1 may not meet an end OP_E of the optical member OP. That is, the end OP_E of the optical member OP may not be seen to the user. Although a portion of light incident at a position that is more away from the module hole MH than the first point P1 while the first angle AG1 is maintained may have a path toward the end OP_E of the optical member OP, before the light has the path, the light is dissipated by being absorbed by the light shielding pattern BR-A.

According to an exemplary embodiment of the inventive concepts, although the module hole MH is defined in the optical member OP, as the light shielding pattern BR-A is further contained, the end OP_E of the optical member OP may not be seen to the user. Also, as a hole area HA_A is controlled in size so that the light shielding pattern BR-A is disposed at a position at which the first light L1 may not reach to the end OP_E of the optical member OP, a defect in which the end OP_E of the optical member OP is seen from the outside may be prevented, and appearance of the display apparatus may be enhanced.

As illustrated in FIG. 5B, the window member 100-B includes a base panel BP-B, a light shielding pattern BR-B, and a hole panel WP-B. The window member 100-B include components corresponding to those of the window member 100-A in FIG. 5A except for the position of the light shielding pattern BR-B. Hereinafter, overlapping description will be omitted.

As illustrated in FIG. 5B, when light L2 (hereinafter, referred to as second light) corresponding to the user's view is incident at an angle of a second angle AG2 into the window member 100-B, the second light L2 passes a lowermost point P2 (hereinafter, referred to as a second point) of the light shielding pattern BR-B, which contacts the base panel BP-B, and passes through the window member 100-B.

Here, the second light L2 may not meet an end OP_E of the optical member OP. That is, the end OP_E of the optical member OP may not be seen to the user. Although a portion of light incident at a position that is more adjacent to the module hole MH than the second point P2 while the second angle AG2 is maintained may have a path toward the end OP_E of the optical member OP, before the light has the path, the light is dissipated by being absorbed by the light shielding pattern BR-B.

According to an exemplary embodiment of the inventive concepts, although the module hole MH is defined in the optical member OP, as the light shielding pattern BR-B is further contained, the end OP_E of the optical member OP may not be seen to the user. Also, as a hole area HA_B is controlled in size so that the light shielding pattern BR-B is disposed at a position at which the second light L2 may not reach to the end OP_E of the optical member OP, a defect in which the end OP_E of the optical member OP is seen from the outside may be prevented, and the appearance of the display apparatus may be enhanced.

As illustrated in FIG. 5C, the window member 100-C includes a base panel BP-C, a light shielding pattern BR-C, and a hole panel WP-C. The window member 100-C include components corresponding to those of the window members 100-A and 100-B in FIGS. 5A and 5B except for the position of the light shielding patterns BR-C. Hereinafter, overlapping description will be omitted.

When light L3 (hereinafter, referred to as third light) corresponding to the user's view is incident at an angle of a third angle AG3 into the window member 100-C, the third light L3 passes a lowermost point P3 (hereinafter, referred to as a third point) of the light shielding pattern BR-C, which contacts the base panel BP-C, and passes through the window member 100-C. In the exemplary embodiment, although the first to third angles AG1, AG2, and AG3 are equal to each other, the angles may include all angles by which the user's view may reach.

Here, the third light L3 may be incident toward the end OP_E of the optical member OP. However, the third point P3 corresponds to a point that also contacts the light shielding pattern BR-C. Accordingly, although the third light L3 may have a path toward the end OP_E of the optical member OP, at the same time, the third light L3 is dissipated by being absorbed by the light shielding pattern BR-C.

According to an exemplary embodiment of the inventive concepts, a hole area HA_C may have the substantially same size and shape as those of the module hole MH. According to an exemplary embodiment of the inventive concepts, although the module hole MH is defined in the optical member OP, as the light shielding pattern BR-C is further contained, the end OP_E of the optical member OP may not be seen to the user. Thus, as the hole area HA_C is controlled in size, a defect in which the end OP_E of the optical member OP is seen from the outside may be prevented, and the appearance of the display apparatus may be enhanced.

Figure 6A:
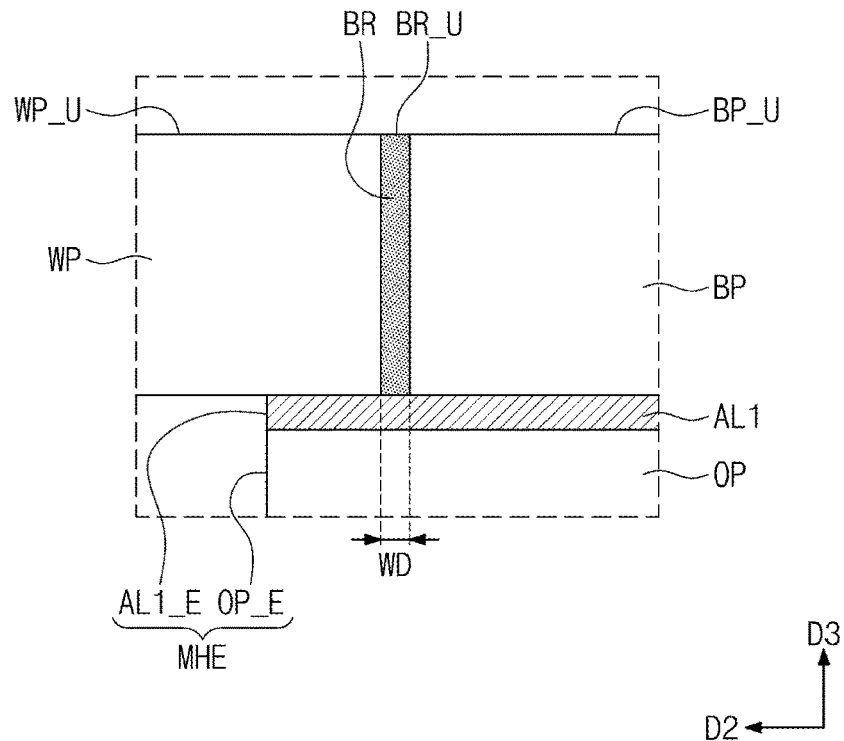
FIGS. 6A, 6B, and 6C are cross-sectional views illustrating a portion of a display apparatus according to an exemplary embodiment of the inventive concepts.
Figure 6B:
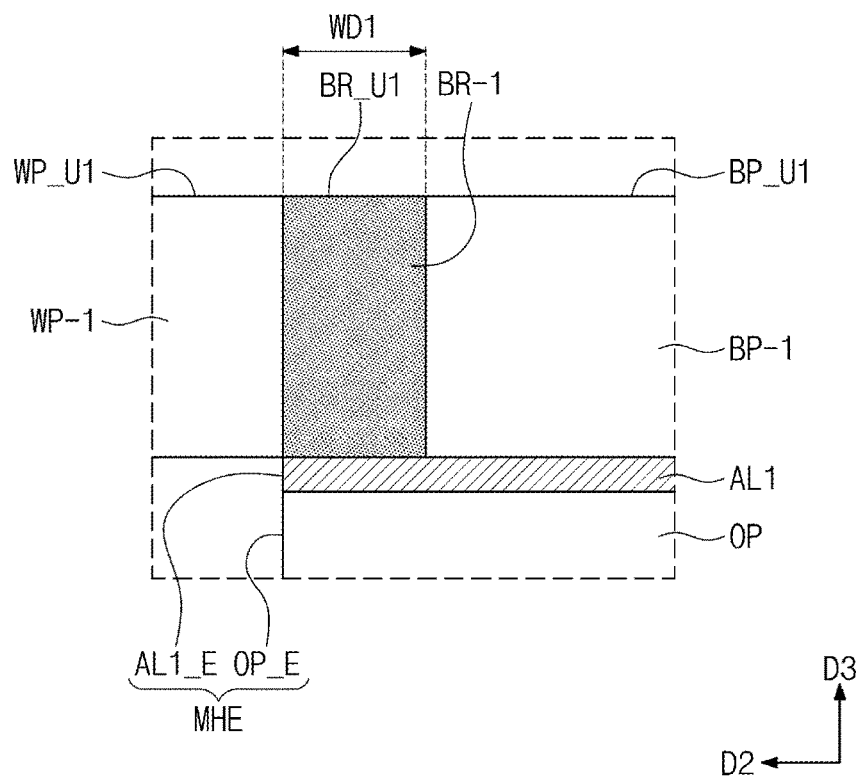
Figure 6C:
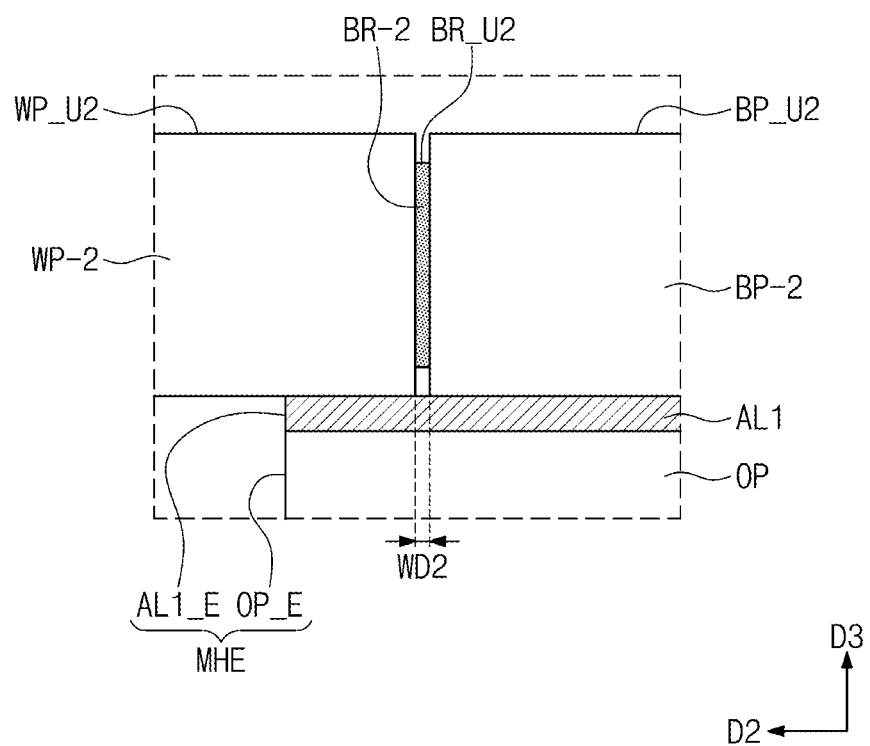

FIGS. 6A, 6B, and 6C are cross-sectional views illustrating a portion of a display apparatus according to an exemplary embodiment of the inventive concepts. In FIGS. 6A to 6C, an area corresponding to an area YY' in FIG. 3A is enlarged for ease of description. Hereinafter, an exemplary embodiment of the inventive concepts will be described with reference to FIGS. 6A to 6C. Meanwhile, the same elements as those described in FIGS. 1A to 5B are designated by the same reference symbols, and overlapping description will be omitted.

As illustrated in FIG. 6A, a light shielding pattern BR is disposed between a hole panel WP and a base panel BP. The light shielding pattern BR contacts each of the base panel BP and the hole panel WP to couple the base panel BP to the hole panel WP and fills a space between the hole panel WP and the base panel BP. A distance WD between the hole panel WP and the base panel BP may correspond to a width of the light shielding pattern BR in the second direction D2.

A first end MHE of a display module includes an end OP_E of an optical member OP and an end AL1_E of a first adhesion member AL1. The light shielding pattern BR is disposed at a position that is farther away from a module hole than the first end MHE.

The light shielding pattern BR may have a front surface BR_U that is aligned with a front surface WP_U of the hole panel WP and a front surface BP_U of the base panel BP. Accordingly, the front surface BR_U of the light shielding pattern BR, the front surface WP_U of the hole panel WP, and the front surface BP_U of the base panel BP may define a plane.

As illustrated in FIG. 6B, a distance WD1 between a hole panel WP-1 and a base panel BP-1 may be increased more than the distance WD in FIG. 6A. For example, the hole panel WP-1 may have a shape having the same surface area as that of a module hole. A side surface of the hole panel WP-1 and a first end MHE of a display module may be aligned with each other in the third direction D3. A front surface WP_U1 of the hole panel WP-1, a front surface BR_U1 of a light shielding pattern BR-1, and a front surface BP_U1 of a base panel BP-1 may define a plane.

The distance WD1 between the hole panel WP-1 and the base panel BP-1 may substantially correspond to a width of the light shielding pattern BR-1. According to the embodiment, although the distance WD1 between the hole panel WP-1 and the base panel BP-1 increases, the hole panel WP-1 and the base panel BP-1 may be stably coupled to each other by the light shielding pattern BR-1.

Referring to FIG. 6C, a distance WD2 between a hole panel WP-2 and a base panel BP-2 may be smaller than the distance WD in FIG. 6A. As the distance WD2 between the hole panel WP-2 and the base panel BP-2 decreases, a width of a light shielding pattern BR-2 may decrease. Here, a front surface WP_U2 of the hole panel WP-2, a front surface BR_U2 of the light shielding pattern BR-2, and a front surface BP_U2 of the base panel BP-2 are not aligned. According to an exemplary embodiment of the inventive concepts, although the distance WD2 between the hole panel WP-2 and the base panel BP-2 decreases, the hole panel WP-2 and the base panel BP-2 may be stably coupled to each other even by the small light shielding pattern BR-2.

FIGS. 7A, 7B, 7C, and 7D are cross-sectional views illustrating a portion of a display apparatus according to an exemplary embodiment of the inventive concepts. In FIGS. 7A to 7D, areas corresponding to an area YY' in FIG. 3A are illustrated for ease of description. Hereinafter, an exemplary embodiment of the inventive concepts will be described with reference to FIGS. 7A to 7D. Meanwhile, the same elements as those described in FIGS. 1A to 6C are designated by the same reference symbols, and overlapping description will be omitted.

Figure 7A:
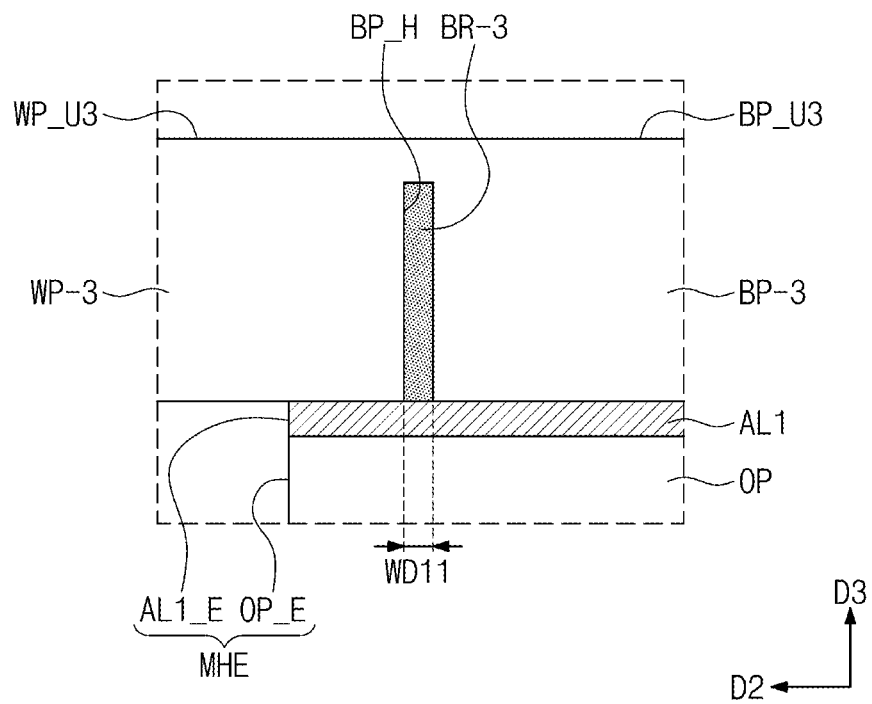
FIGS. 7A, 7B, 7C, and 7D are cross-sectional views illustrating a portion of a display apparatus according to an exemplary embodiment of the inventive concepts.

As illustrated in FIG. 7A, a hole panel WP-3 and a base panel BP-3 may have an integrated shape. The hole panel WP-3 and a base panel BP-3 may be connected to each other. A front surface WP_U3 of the hole panel WP-3 and a front surface BP_U3 of the base panel BP-3 are connected to each other to have an integrated shape.

A recessed portion BP_H defined in the base panel BP-3 may be a groove. The recessed portion BP_H (hereinafter, referred to as a groove) may be defined by being recessed from a rear surface of the base panel BP-3. The groove BP_H may not extend to the front surface of the base panel BP-3. As the groove BP-H is defined in the base panel BP-3, the hole panel WP-3 and the base panel BP-3 may be connected to each other to have an integrated shape.

A light shielding pattern BR-3 is disposed in the groove BP_H. Accordingly, the light shielding pattern BR-3 may not be exposed from the front surface BP_U3 of the base panel BP-3 or the front surface WP_U3 of the hole panel WP-3. According to an exemplary embodiment of the inventive concepts, although the light shielding pattern BR-3 is further contained, a front surface of a window member may be provided by one front surface BP_U3 of the base panel BP-3.

Figure 7B:
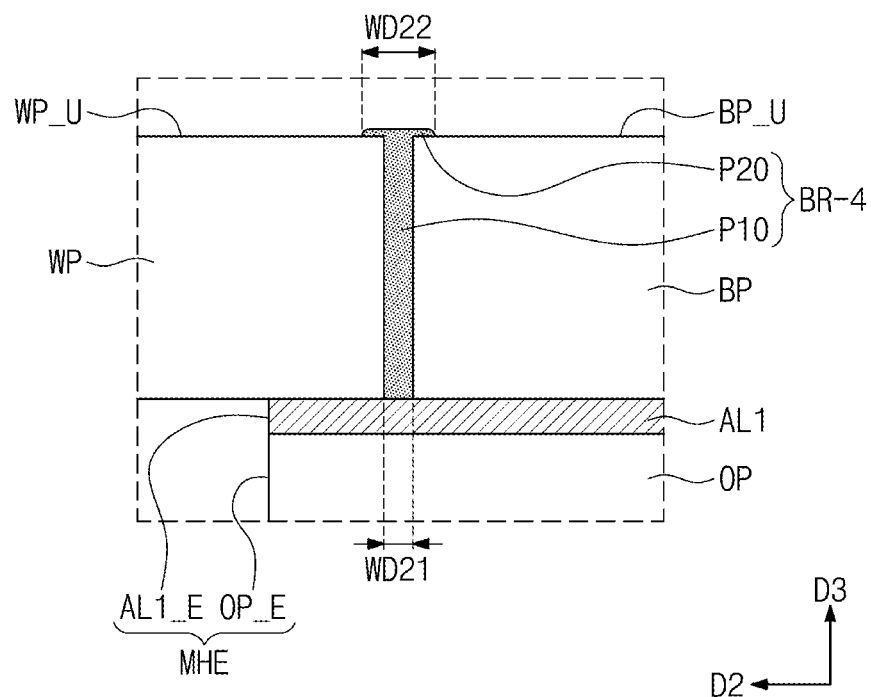

As illustrated in FIG. 7B, at least a portion of a light shielding pattern BR-4 may partially cover a front surface BP_U of a base panel BP or a front surface WP_U of a hole panel WP. Specifically, a light shielding pattern BR-4 may include a first portion P10 and a second portion P20. The first portion P10 fills a distance WD21 between the hole panel WP and the base panel BP. The first portion P10 may have the substantially same thickness as the base panel BP.

The second portion P20 is connected to the first portion P10. The second portion P20 may cover a portion of the front surface of the base panel BP and a portion of the front surface of the hole panel WP. The second portion P20 may have a width WD22 that is equal to or greater than the distance WD21 between the hole panel WP and the base panel BP.

The second portion P20 may be formed such that a portion of the light shielding pattern BR-4, which is provided in a state having liquidity, is discharged to the front surface of the base panel BP in a process of forming the light shielding pattern BR-4. According to an exemplary embodiment of the inventive concepts, the light shielding pattern BR-4 may have various shapes according to a process environment or condition. However, exemplary embodiments of the inventive concepts are not limited thereto.

Figure 7C:
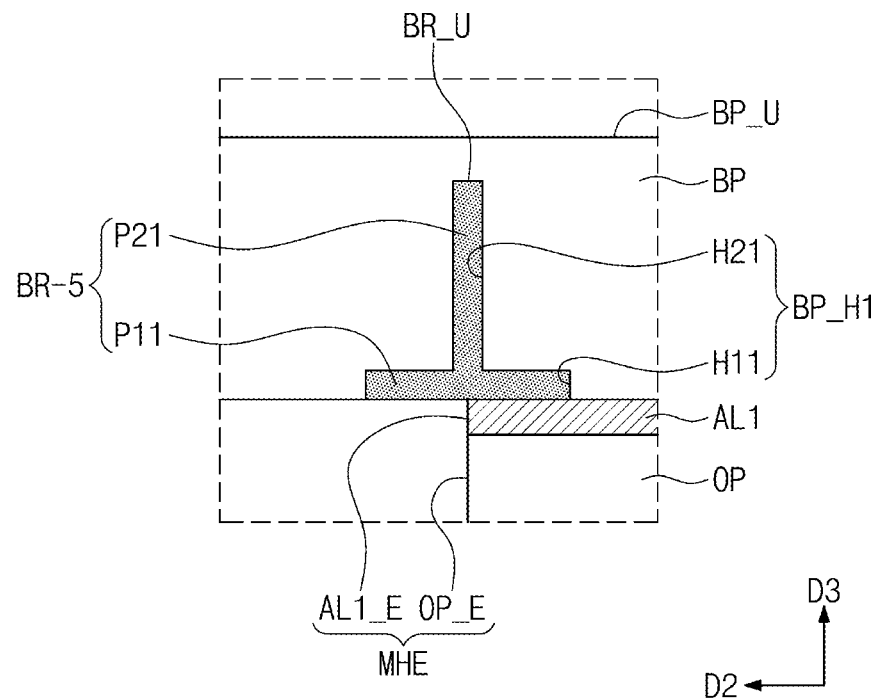

As illustrated in FIG. 7C, a recessed portion BP_H1 defined in a base panel BP may include a first recessed portion H11 and a second recessed portion H21. The first recessed portion H11 is recessed from a rear surface of the base panel BP and has a first width in the second direction D2. The second recessed portion H21 is connected to the first recessed portion H11. The second recessed portion H21 is recessed from the first recessed portion H11 and has a second width in the second direction D2. Each of the first recessed portion H11 and the second recessed portion H21 may be a groove. The second width may be less than the first width.

A light shielding pattern BR-5 fills the recessed portion BP-H1. Specifically, the light shielding pattern BR-5 may include a first portion P11 that fills the first recessed portion H11 and a second portion P21 that is connected to the first portion P11 and fills the second recessed portion H21. The second portion P21 is not exposed from a front surface of the base panel BP since a front surface BR_U of BR-5 does not extend through the base panel BP. According to an exemplary embodiment of the inventive concepts, the light shielding pattern BR-5 may have an upside down "T" shape in a cross-sectional view.

The light shielding pattern BR-5 may overlap a first end MHE of a display module. Here, since the light shielding pattern BR-5 is inserted into the base panel BP, the light shielding pattern BR-5, particularly the second portion P21, does not protrude from the rear surface of the base panel BP. Accordingly, a limitation of forming a stepped portion on an optical member OP or an adhesion member AL1 disposed on the rear surface of the base panel BP may be prevented by the light shielding pattern BR-5. Thus, a limitation such as delamination of the first end MHE may be resolved to improve reliability of the electronic apparatus.

Figure 7D:
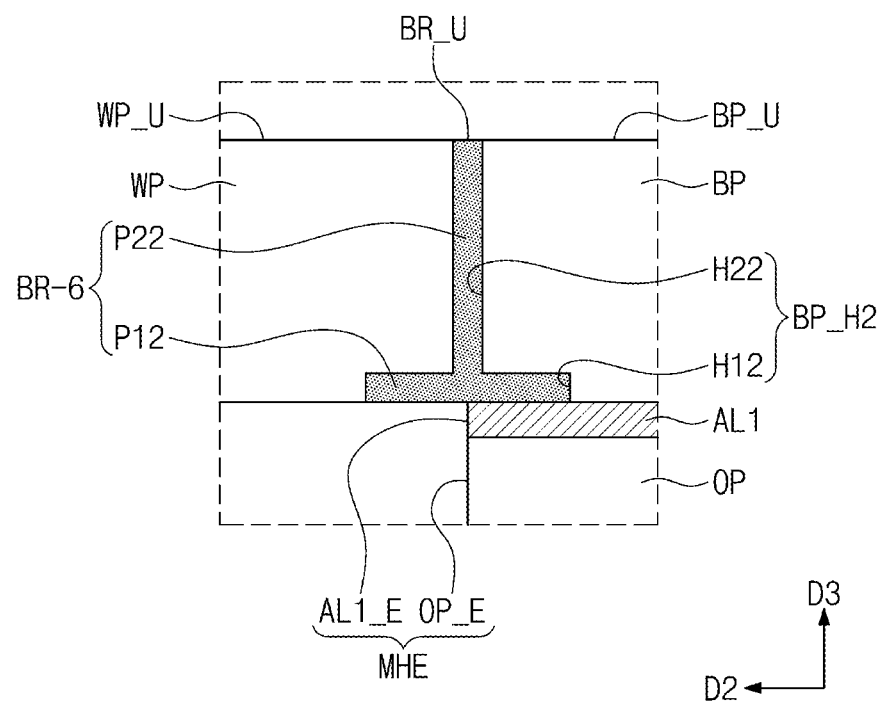

Also, as illustrated in FIG. 7D, a recessed portion BP_H2 defined in a window member may include a groove and a through-hole. Specifically, the recessed portion BP_H2 includes a first recessed portion H12 and a second recessed portion H22. The first recessed portion H12 may be a groove that is recessed from a rear surface of a base panel BP. The first recessed portion H12 may correspond to the first recessed portion H11 in FIG. 7C.

The second recessed portion H22 may be a through-hole that is connected to the first recessed portion H12 and recessed from the first recessed portion H12 in the third direction D3. The second recessed portion H22 extends until a front surface BP_U of the base panel BP.

The recessed portion BP_H2 may be defined by each of the base panel BP and the hole panel WP. Specifically, the first recessed portion H12 may be defined by a groove defined in the base panel BP and a groove defined in the hole panel WP. Also, the second recessed portion H22 may be defined by a spaced space between the base panel BP and the hole panel WP.

A light shielding pattern BR-6 is disposed in the recessed portion BP_H2 to fill the recessed portion BP_H2. Specifically, the light shielding pattern BR-6 includes a first portion P12 that fills the first recessed portion H12 and a second portion P22 that fills the second recessed portion H22. The first portion P21 defines the same plane with the rear surface of the base panel BP. Accordingly, a limitation of forming a stepped portion of an optical member OP or an adhesion member AL1 may be prevented by the light shielding pattern BR-6 to resolve a limitation of delamination of a first end MHE.

Also, the second portion P22 includes a front surface BR_U that defines the same plane with the front surface BP_U of the base panel BP and the front surface of the hole panel WP_U. Accordingly, a sense of difference, which may be generated on a front surface of a window member due to the light shielding pattern BR-6, may be diminished.

According to an exemplary embodiment of the inventive concepts, as the light shielding pattern BR-5 and BR-6 includes the first portion P11 and P12 and the second portion P21 and P22, an area overlapping the first end MHE may be relatively large. Thus, a limitation in which the first end MHE is seen from the front surface of the window member by the user may be easily prevented to improve the appearance of the electronic apparatus.

Figure 8A:
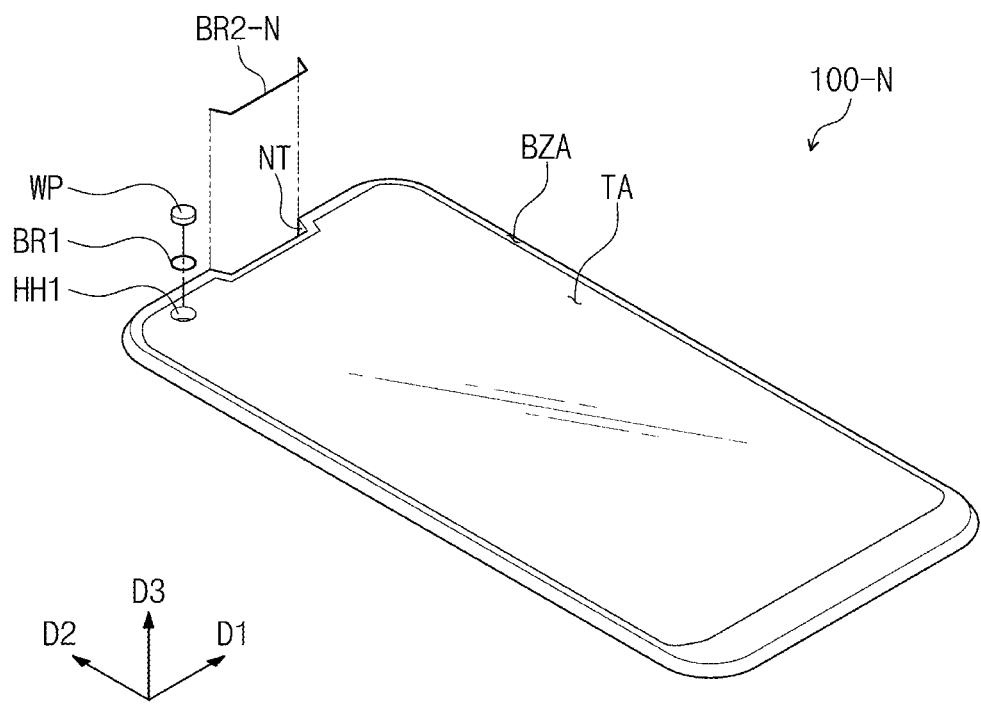
FIG. 8A is an exploded perspective view illustrating a window member according to an exemplary embodiment of the inventive concepts.
Figure 8B:
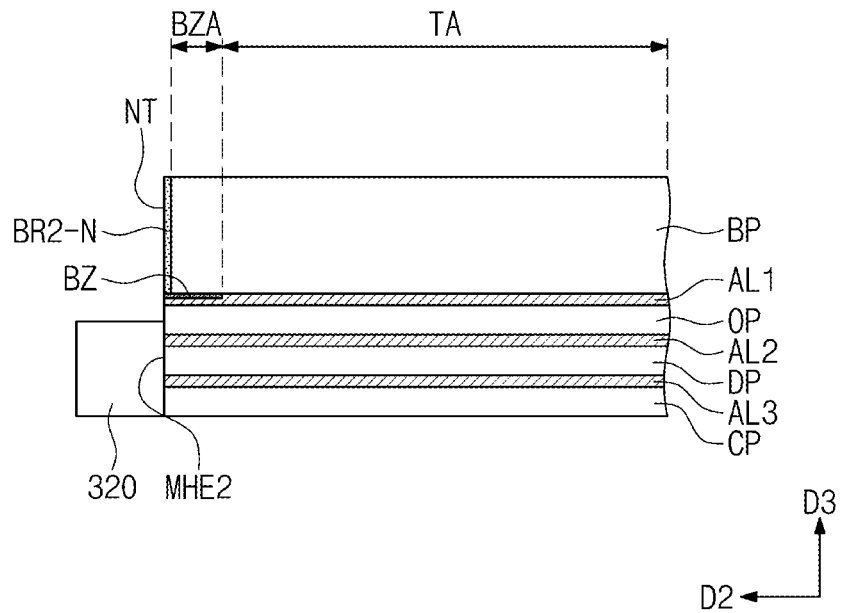
FIG. 8B is a cross-sectional view illustrating a portion of an electronic apparatus.

FIG. 8A is an exploded perspective view illustrating a window member according to an exemplary embodiment of the inventive concepts. FIG. 8B is a cross-sectional view illustrating a portion of the electronic apparatus. Hereinafter, an exemplary embodiment of the inventive concepts will be described with reference to FIGS. 8A and 8B.

As illustrated in FIG. 8A, a window member 100-N may further include a predetermined notch NT. The notch NT may be defined at one side of a base panel BP. In the embodiment, the notch NT may be defined such that a portion of a side extending in the first direction D1 is recessed in an opposite direction of the second direction D2.

The window member 100-N includes a first light shielding pattern BR1 and a second light shielding pattern BR2-N. The first light shielding pattern BR1 may be disposed in a first hole HH1 to couple a hole panel WP to a base panel BP. The first light shielding pattern BR1 corresponds to the first light shielding pattern BR1 in FIG. 2, and thus overlapping description will be omitted.

The second light shielding pattern BR2-N may be disposed along an inner surface of the notch NT. The second light shielding pattern BR2-N may have a shape in which one portion is opened from a closed curve in a plan view. A side defining the shape of the second light shielding pattern BR2-N on the plane may have a shape in which a portion of the closed curve is removed. For example, the second light shielding pattern BR2-N may have various shapes such as a polygonal shape in which one side is opened, a circular shape in which one side is opened, or an oval shape in which one side is opened. The second light shielding pattern BR2-N may have a shape on the plane, which corresponds to that of the notch NT.

The notch NT may be defined in an area overlapping an electronic module 320, wherein the electronic module 320 may correspond to the second electronic module 320 in FIG. 1B, and thus overlapping description will be omitted.

The electronic module 320 may be disposed adjacent to a second end MHE2 of the display module. According to the exemplary embodiment, as a bezel layer BZ and the second light shielding pattern BR2-N are further contained, the second end MHE2 is not seen to the user. Thus, the appearance of the electronic apparatus may be enhanced.

According to an exemplary embodiment of the inventive concepts, the window member 100-N may include recessed portions having various shapes as long as the recessed portions overlap the electronic module 320. In the window member 100-N, the recessed portion is provided as the first hole HH1 and the notch NT. Also, according to an exemplary embodiment of the inventive concepts, as the light shielding patterns BR1 and BR2-N are disposed in correspondence to various shapes of the recessed portions, a limitation in which the end MHE2 of the display module is seen from the recessed portion may be easily resolved.

Figure 9:
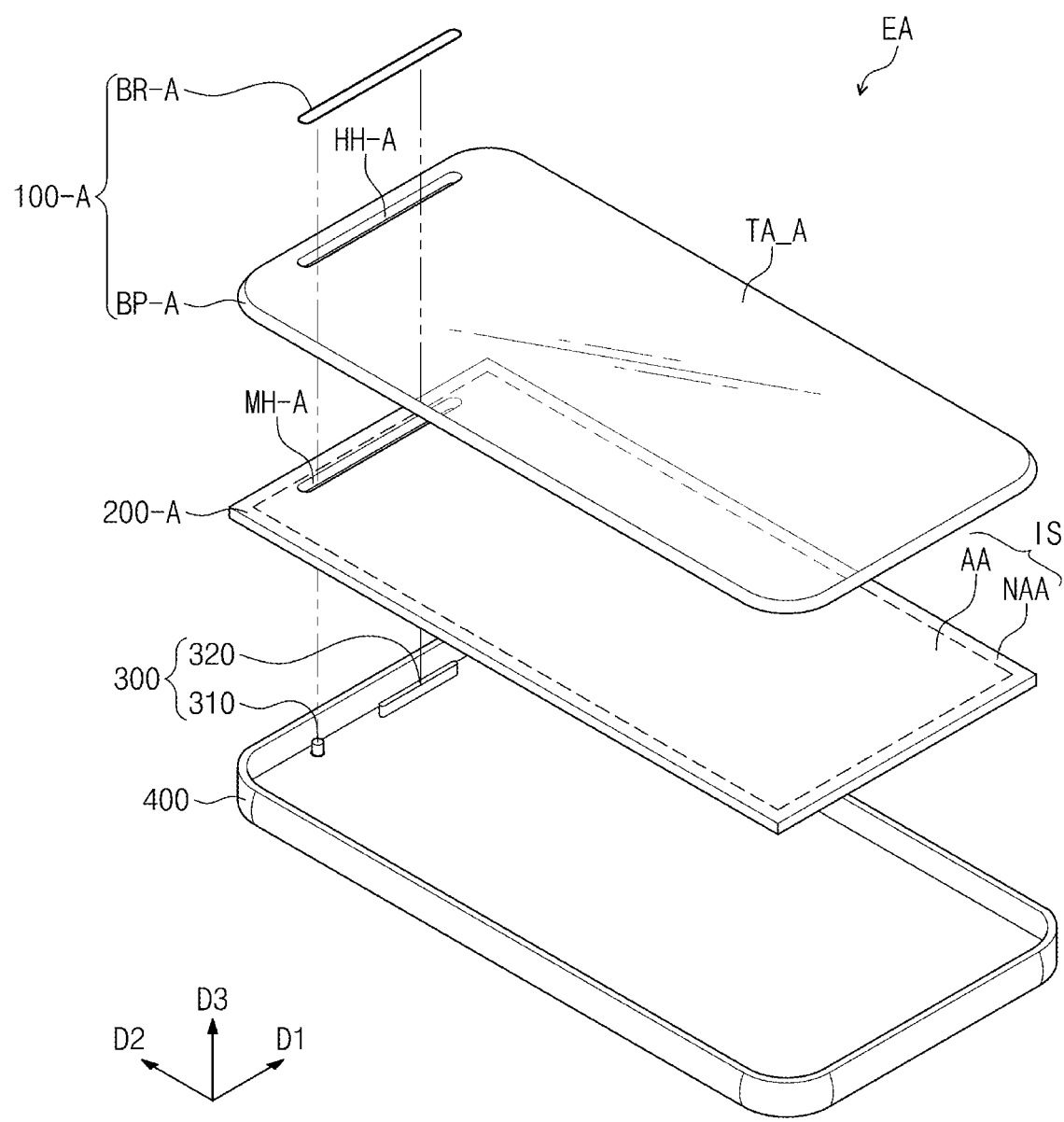
FIG. 9 is an exploded perspective view illustrating an electronic apparatus according to an exemplary embodiment of the inventive concepts.

FIG. 9 is an exploded perspective view illustrating an electronic apparatus EA according to an exemplary embodiment of the inventive concepts. Hereinafter, an exemplary embodiment of the inventive concepts will be described with reference to FIG. 9. Here, the same elements as those described in FIGS. 1A to 8B are designated by the same reference symbols, and overlapping description will be omitted.

As illustrated in FIG. 9, a window member 100-A includes a base panel BP-A and a light shielding pattern BR-A. A predetermined recessed portion HH-A may be defined in the base panel BP-A. The recessed portion HH-A may be defined as a through-hole having a bar shape extending in the first direction D1 on the plane.

The light shielding pattern BR-A may be disposed in the recessed portion HH-A. The light shielding pattern BR-A may cover an inner surface of the recessed portion HH-A. The light shielding pattern BR-A may have an elongated ring shape corresponding to the bar shape of the recessed portion HH-A.

In the window member 100-A according to an exemplary embodiment of the inventive concepts, a bezel layer BZ (refer to FIG. 3A) may be omitted. Accordingly, a front surface of the window member 100-A may be provided as a transmission area TA_A.

A display module 200-A may have a front surface IS including an active area AA and a peripheral area NAA. The front surface IS is disposed to face the window member 100-N. The display module 200-A may include a display panel DP (refer to FIG. 3A) for displaying an image on the active area AA and an optical member OP (refer to FIG. 3A) disposed on the display panel DP.

Also, a module hole MH-A passing through the display module 200-A may be defined in the active area AA of the display module 200-A. The module hole MH-A may have a bar shape extending in the first direction D1 on the plane.

The module hole MH-A may overlap all of a first electronic module 310 and a second electronic module 320. Each of the first electronic module 310 and the second electronic module 320 may be inserted into the module hole MH-A to overlap the recessed portion HH-A on the plane. According to an exemplary embodiment of the inventive concepts, the first electronic module 310 and a second electronic module 320 may receive an external signal or provide an output signal to the outside through the common module hole MH-A and the common recessed portion HH-A.

According to an exemplary embodiment of the inventive concepts, the light shielding pattern BR-A may prevent an end of the display module 200-A, which defines an inner surface of the module hole MH-A, from being seen from the window member 100-A by the user. The light shielding pattern BR-A may block a view path of the user, which faces the inner surface of the module hole MH-A, to prevent the inner surface of the module hole MH-A from being seen. Thus, the appearance of the electronic apparatus EA may be enhanced.

According to an exemplary embodiment of the inventive concepts, although an inner surface of the recessed portion HH-A is covered by the light shielding pattern BR-A, a component such as a separated hole panel WP (refer to FIG. 2) is not disposed in the recessed portion HH-A. However, exemplary embodiments of the inventive concepts are not limited thereto. For example, a hole panel inserted into the recessed portion HH-A may be further disposed.

According to the exemplary embodiments of the inventive concepts, a limitation in which the end of the display module including the optical member is seen to the user through the window member may be easily resolved. Also, a limitation of delamination of the end of the display module disposed adjacent to the electronic module may be prevented to improve the reliability of the electronic apparatus.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic apparatus comprising:
   a window member comprising a base panel in which a recessed portion is defined therein and a light shielding pattern filled in the recessed portion;
   a display panel having an active area configured for displaying an image and a peripheral area disposed adjacent to the active area and an optical member disposed on the display panel to overlap the active area and the peripheral area;
   an optical member disposed on the display panel to overlap the active area and the peripheral area; and
   an electronic module overlapping the active area in a plan view,
   wherein the light shielding pattern overlaps the active area and is adjacent to the electronic module in a plan view, and
   a rear surface of the light shielding pattern is aligned with the rear surface of the base panel in a cross-sectional view.

2. The electronic apparatus of claim 1, wherein the light shielding pattern has a thickness equal to or less than that of the base panel.

3. The electronic apparatus of claim 1, wherein the recessed portion is defined as a through-hole passing through the base panel,
   the light shielding pattern covers an inner surface of the through-hole, and
   at least a portion of the light shielding pattern is exposed from the front surface of the base panel.

4. The electronic apparatus of claim 3, wherein the window member further comprises a hole panel disposed in the through-hole to overlap the electronic module, and the light shielding pattern fills a gap between the hole panel and the base panel.

5. The electronic apparatus of claim 4, wherein the hole panel contains the same material as the base panel.

6. The electronic apparatus of claim 4, wherein the hole panel has a surface area equal to or greater than that of the electronic module.

7. The electronic apparatus of claim 1, wherein the recessed portion comprises:

a first recessed portion recessed from the rear surface of the base panel and having a first width; and a second recessed portion recessed from the first recessed portion while being connected to the first recessed portion and having a second width less than the first width, and the light shielding pattern fills the first recessed portion and the second recessed portion.

8. The electronic apparatus of claim 7, wherein the light shielding pattern defines the same plane with the rear surface of the base panel.

9. The electronic apparatus of claim 7, wherein the light shielding pattern overlaps the electronic module in a plan view.

10. The electronic apparatus of claim 1, wherein the light shielding pattern has an adhesion property.

11. The electronic apparatus of claim 1, further comprising a plurality of adhesion layers disposed between the display panel and the optical member and between the optical member and the window member.

12. The electronic apparatus of claim 11, wherein the display panel comprises an organic light emitting element.

13. The electronic apparatus of claim 12, wherein the optical member comprises a polarizing film.

14. The electronic apparatus of claim 1, wherein the window member further comprises a bezel layer disposed on the rear surface of the base panel to overlap the peripheral area, and the light shielding pattern is spaced apart from the bezel layer in a plan view.

15. The electronic apparatus of claim 14, further comprising an additional electronic module disposed to overlap the bezel layer, wherein the window member further comprises an additional light shielding pattern disposed in an additional recessed portion defined in an area overlapping the bezel layer.

16. The electronic apparatus of claim 1, wherein the light shielding pattern has a closed curve shape in a plan view.

17. The electronic apparatus of claim 1, wherein the base panel further comprises a notch defined at one side thereof, and the light shielding pattern covers an inner surface of the notch.

18. The electronic apparatus of claim 17, wherein the light shielding pattern has a shape in which one portion is opened from a closed curve in a plan view.

* * * * *